(12) United States Patent
Wu et al.

(10) Patent No.: US 12,124,923 B2
(45) Date of Patent: Oct. 22, 2024

(54) QUANTUM GATE OPTIMIZATION METHOD AND APPARATUS, DEVICE, AND STORAGE MEDIUM

(71) Applicants: Shenzhen Tencent Computer Systems Company Limited, Shenzhen (CN); Zhejiang University, Hangzhou (CN)

(72) Inventors: Jianlan Wu, Shenzhen (CN); Yi Yin, Shenzhen (CN); Zhiwen Zong, Shenzhen (CN)

(73) Assignees: SHENZHEN TENCENT COMPUTER SYSTEMS COMPANY LIMITED, Shenzhen (CN); ZHEJIANG UNIVERSITY, Hangzhou (CN)

( * ) Notice: Subject to any disclaimer, the term of this patent is extended or adjusted under 35 U.S.C. 154(b) by 328 days.

(21) Appl. No.: 17/721,227

(22) Filed: Apr. 14, 2022

(65) Prior Publication Data

US 2022/0351064 A1   Nov. 3, 2022

Related U.S. Application Data

(63) Continuation of application No. PCT/CN2021/121487, filed on Sep. 28, 2021.

(30) Foreign Application Priority Data

Apr. 15, 2021   (CN) .......................... 202110410057.9

(51) Int. Cl.
*G06N 10/60*   (2022.01)
*G06N 10/20*   (2022.01)

(52) U.S. Cl.
CPC ............. *G06N 10/60* (2022.01); *G06N 10/20* (2022.01)

(58) Field of Classification Search
CPC ........ G06N 10/40; G06N 10/20; G06N 10/70; G06N 10/60; G06F 30/337; G06F 11/3003

See application file for complete search history.

(56) References Cited

U.S. PATENT DOCUMENTS 11,474,867 B2 * 10/2022 Bonderson ............. G06N 10/00
11,507,872 B2 * 11/2022 Cao ........................ H03K 19/21

(Continued)

FOREIGN PATENT DOCUMENTS

CN    109217939 A    1/2019
CN    110612540 A    12/2019

(Continued)

OTHER PUBLICATIONS

Re-Bing Wu et al., "Data-Driven Gradient Algorithm for High-Precision Quantum Control", Physical Review A, Apr. 24, 2018, 4 pgs., Retrieved from the Internet: https://journals.aps.org/pra/abstract/10_1103/PhysReyA_97_042122.

(Continued)

*Primary Examiner* — An H Do
(74) *Attorney, Agent, or Firm* — Morgan, Lewis & Bockius LLP

(57) ABSTRACT

This application discloses a quantum gate optimization method performed by a computer device. The method includes: obtaining an initialized control external field corresponding to a quantum gate; applying the control external field to a quantum bit (qubit) corresponding to the quantum gate, and acquiring actual measurement data of the quantum gate, the actual measurement data being used for reflecting an actual characteristic of the quantum gate; calculating a gradient corresponding to the control external field based on the actual measurement data and ideal data, the ideal data being used for reflecting an ideal characteristic of the quantum gate; and updating the control external field (Continued)

according to the gradient to obtain an updated control external field, the updated control external field being applied to the qubit corresponding to the quantum gate to optimize precision of the quantum gate. The method is a closed-loop optimization solution driven and implemented by data feedback.

20 Claims, 3 Drawing Sheets

(56) References Cited

U.S. PATENT DOCUMENTS

| | | | | |
|---|---|---|---|---|
| 11,763,187 | B2* | 9/2023 | Babbush | G06N 10/60 706/12 |
| 11,928,586 | B2* | 3/2024 | Niu | G06N 3/045 |
| 2015/0358022 | A1 | 12/2015 | McDermott, III et al. | |
| 2018/0123597 | A1 | 5/2018 | Sete et al. | |
| 2020/0327441 | A1 | 10/2020 | Cao et al. | |
| 2020/0364602 | A1 | 11/2020 | Niu et al. | |
| 2020/0410343 | A1 | 12/2020 | Niu et al. | |

FOREIGN PATENT DOCUMENTS

| | | |
|---|---|---|
| CN | 111369004 A | 7/2020 |
| CN | 112313677 A | 2/2021 |
| CN | 112488317 A | 3/2021 |
| CN | 113158615 A | 7/2021 |

OTHER PUBLICATIONS

Qi Yin "Studies on Theories and Optical Experiments of Quantum Tomography Technics", A dissertation for doctor degree, University of Science and Technology of China, Oct. 15, 2018, 16 pgs.
Tencent Technology, WO, PCT/CN2021/121487, Jan. 13, 2022, 4 pgs.
Tencent Technology, IPRP, PCT/CN2021/121487, Oct. 12, 2023, 5 pgs.
Tencent Technology, European Office Action, EP 21835572.5, Oct. 19, 2023, 11 pgs.
Extended European Search Report, EP21835572.5, Oct. 11, 2022, 11 pgs.
Tencent Technology, ISR, PCT/CN2021/121487, Jan. 13, 2022, 2 pgs.

* cited by examiner

QUANTUM GATE OPTIMIZATION METHOD AND APPARATUS, DEVICE, AND STORAGE MEDIUM

CROSS REFERENCE TO RELATED APPLICATIONS

This application is a continuation application of PCT Patent Application No. PCT/CN2021/121487, entitled "QUANTUM GATE OPTIMIZATION METHOD AND APPARATUS, DEVICE, AND STORAGE MEDIUM", filed on Sep. 28, 2021, which claims priority to Chinese Patent Application No. 202110410057.9, entitled "QUANTUM GATE OPTIMIZATION METHOD AND APPARATUS, DEVICE, AND STORAGE MEDIUM" filed on Apr. 15, 2021, both of which are incorporated by reference in their entirety.

FIELD OF THE TECHNOLOGY

Embodiments of this application relate to the field of quantum technologies, and in particular, to a quantum gate optimization method and apparatus, a device, and a storage medium.

BACKGROUND OF THE DISCLOSURE

The quantum gate is a basic component of a quantum circuit. A plurality of quantum gates can be combined to construct a complex quantum circuit, so as to implement quantum computing (QC) and quantum simulation. Therefore, the implementation of high-precision quantum gates is essential for QC and quantum simulation.

Currently, none of the quantum gate optimization solutions can improve both the precision and efficiency.

SUMMARY

Embodiments of this application provide a quantum gate optimization method and apparatus, a device, and a storage medium, to provide a quantum gate optimization solution that improves both the precision and efficiency. The technical solutions are as follows:

According to an aspect of the embodiments of this application, a quantum gate optimization method is performed by a computer device, the method including:

obtaining an initialized control external field corresponding to a quantum gate;

applying the control external field to a quantum bit (qubit) corresponding to the quantum gate, and acquiring actual measurement data of the quantum gate, the actual measurement data being used for reflecting an actual characteristic of the quantum gate;

calculating a gradient corresponding to the control external field based on the actual measurement data and ideal data, the ideal data being used for reflecting an ideal characteristic of the quantum gate; and updating the control external field according to the gradient to obtain an updated control external field, the updated control external field being applied to the qubit corresponding to the quantum gate to optimize precision of the quantum gate.

According to an aspect of the embodiments of this application, a computer device is provided, including a processor and a memory, the memory storing at least one instruction, the at least one instruction, when executed by the processor, causing the computer device to implement the foregoing quantum gate optimization method.

According to an aspect of the embodiments of this application, a non-transitory computer-readable storage medium is provided, the computer-readable storage medium storing at least one instruction, and the at least one instruction, when executed by a processor of a computer device, causing the computer device to implement the foregoing quantum gate optimization method.

The technical solutions provided in the embodiments of this application include at least the following beneficial effects:

The quantum gate optimization solution provided in this application is a closed-loop optimization solution driven and implemented by data feedback. By combining a gradient-constrained optimization algorithm with actual measurement data, on the one hand, due to the gradient-constrained optimization of the control external field, this application can shorten an optimization time and lower optimization costs compared with some optimization solution without gradient constraints, and on the other hand, because the actual measurement data of the quantum gate is acquired during optimizations, and optimization is performed by using the actual measurement data as feedback, this application ensures the effect and precision of optimization. With reference to the foregoing two aspects, this application achieves a quantum gate optimization solution that improves both the precision and efficiency.

BRIEF DESCRIPTION OF THE DRAWINGS

To describe the technical solutions of the embodiments of this application more clearly, the following briefly introduces the accompanying drawings required for describing the embodiments. Apparently, the accompanying drawings in the following description show only some embodiments of this application, and a person of ordinary skill in the art may still derive other drawings from these accompanying drawings without creative efforts.

DESCRIPTION OF EMBODIMENTS

Figure 1:
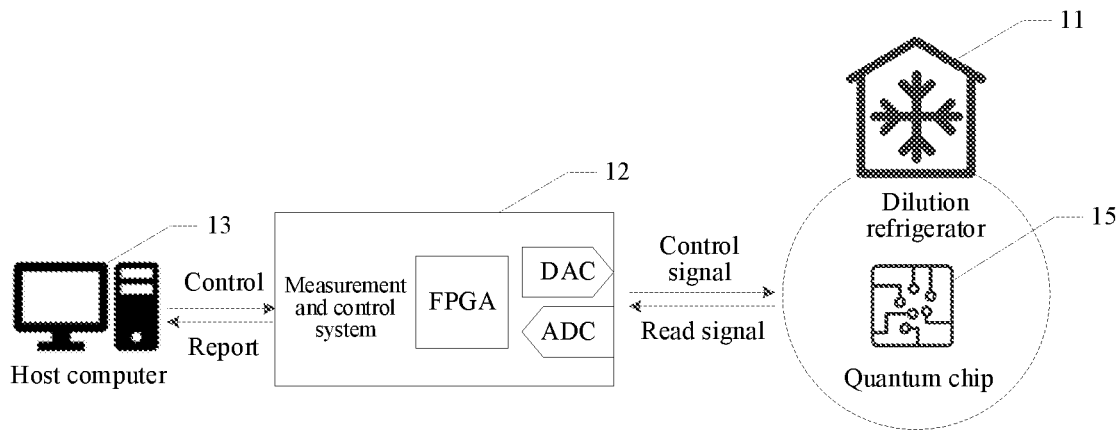
FIG. 1 is a schematic architectural diagram of an experimental platform for a superconducting quantum computer according to this application.

To make the objectives, technical solutions, and advantages of this application clearer, the following further describes implementations of this application in detail with reference to the accompanying drawings.

Before embodiments of this application are described, some terms involved in this application are explained first.

1. Quantum computing (QC): A novel computing method that harnesses phenomena of quantum states, such as superposition and entanglement, in quantum mechanics to run algorithms and perform calculations.

2. Quantum bit (qubit): A two-level quantum system, which is a basic unit of QC and may be implemented on different physical carriers.

3. Superconducting quantum bit (SC qubit): A qubit based on a superconducting quantum circuit designed and fabricated using a micro-nano processing technology. Through classical microwave pulse signals, control and quantum state measurement of the SC qubit can be implemented.

4. Quantum circuit and quantum gate: Quantum circuit is a QC model that decomposes a QC process into a series of quantum gate operations on a plurality of qubits.

5. Lindblad equation: An equation used for describing evolution of a density matrix of an open quantum system that satisfies Markov approximation with time under a weak coupling interaction.

6. Quantum state tomography (QST): A commonly used method for calibrating quantum states by performing projection measurement on the quantum states in different directions to construct a corresponding density matrix.

7. Quantum process tomography (QPT): A commonly used method for calibrating a quantum gate, in which different initial states are selected to pass through a specific quantum gate, and corresponding final states are obtained through the QST to construct a process matrix including all information of the quantum gate.

8. Randomized benchmarking measurement: n random Clifford gates are selected, and through an inverse operation, a ground state probability of a gate circuit is obtained by collecting a large number of statistics, and a plurality of measurements are performed by changing the value of n, so that an attenuation rate of a waveform sequence can be extracted.

9. Interleaved randomized benchmarking measurement: n random Clifford gates are selected, and a target quantum gate that needs to be calibrated is inserted at the end, and through an inverse operation, a ground state probability of a gate circuit is obtained by collecting a large number of statistics, and a plurality of measurements are performed by changing the value of n, so that an attenuation rate of a waveform sequence can be extracted. With reference to results of the randomized benchmarking measurement, the precision of the target quantum gate may be further calibrated.

10. GRAPE algorithm: A gradient ascent pulse engineering algorithm, which is mainly obtaining a gradient of a discretized waveform based on a defined objective function, and making, through a plurality of iterations, a waveform converge to near an optimal value.

11. Powell algorithm: An accelerated algorithm that uses a conjugate direction to sequentially perform a one-dimensional search on a multi-dimensional objective function to find a minimum value.

12. Nelder-Mead algorithm: A gradient-free algorithm for finding a minimum value of a multivariate function, of which the core is updating an initially selected simplex according to specific rules until the simplex is small enough, so as to find out an optimized parameter at this time.

13. Control external field: With regard to the SC qubit, a control external field generally refers to a microwave drive applied to a qubit. A microwave applied to a diagonal element part of a bit Hamiltonian is referred to as a control external field in a z direction. A microwave applied to a non-diagonal element part of the bit Hamiltonian is referred to as a control external field in an xy direction.

14. Two-bit probability exchange: After a bit is prepared to an excited state, when another bit is coupled to it, the probability of the excited state will be exchanged between the two bits. The smaller the coupling strength, the weaker the exchange capability.

15. Trivial dynamic phase: Without considering an inter-bit coupling effect, due to the external field in the z direction, a cumulative phase introduced in the diagonal element of the bit is generally referred to as a trivial dynamic phase.

FIG. 1 is a schematic architectural diagram of an experimental platform for a superconducting quantum computer according to an exemplary embodiment of this application. A dilution refrigerator 11 is on the rightmost side of FIG. 1, and is configured to provide a working environment for a quantum chip 15 (such as a superconducting quantum chip). The quantum chip 15 works at a temperature of 10 mK. The quantum chip 15 is controlled by analog waveforms, and therefore, requires a measurement and control system 12 mainly including a field programmable gate array (FPGA) and an analog-to-digital converter (ADC)/digital-to-analog converter (DAC) to provide control and measurement. The measurement and control system 12 is controlled by measurement and control software of a host computer 13, and the measurement and control software determines an experiment that needs to be carried out currently, experimental configurations performed on the measurement and control system 12, and the like. The host computer 13 may be a classic computer such as a personal computer (PC).

An ideal gate operator may be equivalent to a time evolution operator that completely depends on a control external field. Therefore, optimization of a quantum gate may be equivalent to optimization of the control external field corresponding to the quantum gate. The quantum gate optimization solution provided in this application is a closed-loop optimization solution driven and implemented by data feedback. By combining a gradient-constrained optimization algorithm with actual measurement data, on the one hand, due to the gradient-constrained optimization of the control external field, this application can shorten an optimization time and lower optimization costs compared with some optimization solution without gradient constraints, and on the other hand, because the actual measurement data of the quantum gate is acquired during optimization, and optimization is performed by using the actual measurement data as feedback, this application ensures the effect and precision of optimization. With reference to the foregoing two aspects, this application achieves a quantum gate optimization solution that improves both the precision and efficiency.

Before method embodiments of this application are described, an operating environment of the method is described first. A quantum gate optimization method provided in the embodiments of this application may be performed and implemented by a classic computer (such as a PC). For example, the method may be performed and implemented by a classic computer executing a corresponding computer program. Alternatively, the method may be performed and implemented in a hybrid device environment including a classic computer and a quantum computer. For example, the method is implemented by a classic computer and a quantum computer cooperating with each other.

In the following method embodiments, for convenience of description, the description is provided by merely using a computer device as an execution entity of the steps. It is to be understood that the computer device may be a classic computer, or may be a hybrid execution environment including a classic computer and a quantum computer. This is not limited in the embodiments of this application.

In addition, in the embodiments of this application, a controlled Z (CZ) quantum gate (CZ gate for short) is mainly used as an example to introduce the technical solutions of this application. The technical solutions provided in this application are adapted to not only optimization of the CZ gate, but also optimization of some other quantum gates, for example, some common single-bit quantum gates (such as Rx, Ry, and Rz quantum gates) and some other complex quantum gates.

Figure 2:
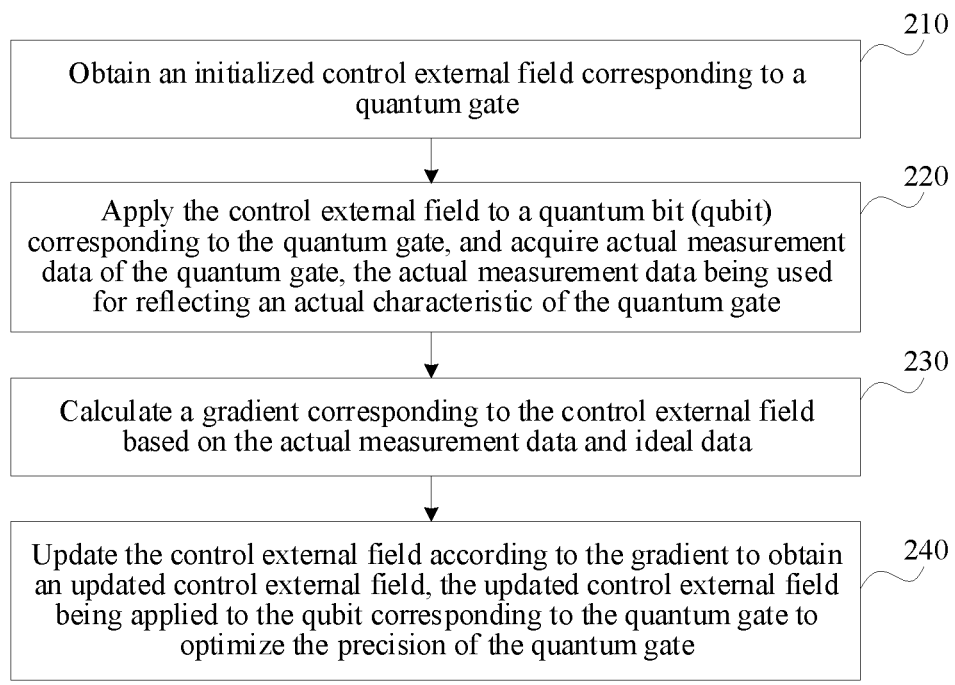
FIG. 2 is a flowchart of a quantum gate optimization method according to this application.

FIG. 2 is a flowchart of a quantum gate optimization method according to an exemplary embodiment of this application. All steps of the method may be performed by a computer device. The method may include the following steps (210 to 240):

Step 210: Obtain an initialized control external field corresponding to a quantum gate.

In the embodiments of this application, a control external field refers to a microwave drive applied to a qubit corresponding to a quantum gate, and the control external field may be a pulse waveform. The initialized control external field may be selected based on experience or experiments.

In the embodiments of this application, a plurality of iterative updates are performed on the control external field to optimize the control external field, and the optimized control external field is applied to the qubit corresponding to the quantum gate to optimize precision of the quantum gate.

The core of quantum gate optimization is to improve the precision. Precision, also referred to as fidelity, refers to the comparison between a measurement result and an ideal value. Experimentally, the precision of a quantum gate can generally be measured by methods such as the QPT and randomized benchmarking measurement.

Step 220: Apply the control external field to a qubit corresponding to the quantum gate, and acquire actual measurement data of the quantum gate, the actual measurement data being used for reflecting an actual characteristic of the quantum gate.

In some embodiments, the control external field is applied to the qubit corresponding to the quantum gate in the following manner: dividing the control external field by time to obtain a pulse waveform sequence, the pulse waveform sequence including pulse waveforms corresponding to a plurality of time points; and applying the pulse waveforms corresponding to the plurality of time points to the qubit corresponding to the quantum gate. For example, when the control external field is denoted as $\mu_A M$, $0<t<T$, and the time T is divided into M parts ($\tau=T/M$), then the control external field $\mu_A(t)$ can be discretized as:

$$\mu_A(t) \Rightarrow \{\mu_{A;1}=\mu_A(t=0), \mu_{A;2}=\mu_A(\tau), \ldots, \mu_{A;M}=\mu_A((M-1)\tau)\} \quad (1)$$

When the quantum gate is a single-bit quantum gate, the control external field may be applied to the single bit corresponding to the quantum gate. When the quantum gate is a multi-bit quantum gate, the corresponding control external field may be applied to only one or some of a plurality of bits corresponding to the quantum gate. For example, for a two-bit CZ gate, the control external field may be applied to only one of the bits.

The quantum gate optimization solution provided in the embodiments of this application is a closed-loop optimization solution driven and implemented by data feedback. Therefore, after the control external field is applied to the qubit corresponding to the quantum gate, the actual measurement data of the quantum gate is acquired through experiments. The actual measurement data is used for reflecting the actual characteristic of the quantum gate, so that the actual measurement data is utilized to implement the closed-loop optimization of the quantum gate (the control external field).

In an exemplary embodiment, the actual measurement data includes an actual gate operator corresponding to the quantum gate. In some embodiments, QPT is performed on the quantum gate to obtain a process matrix corresponding to the quantum gate; and based on the process matrix corresponding to the quantum gate, the actual gate operator corresponding to the quantum gate is determined.

The process matrix corresponding to the quantum gate is generally obtained through the QPT. The QPT is a technique for describing performance of a specific quantum gate, and can provide a visual image related to the process matrix. An ideal unitary evolution can be described directly by the mapping $\psi_f = U_{ideal}\psi(0)$ of quantum states. However, a non-ideal system with noise has to be described by using a density matrix. It is considered that, there is a process matrix-dependent mapping relationship between an input quantum state $\rho(0)$ and an output quantum state $\rho_f$, which is expanded into a superposition of a set of linear operators $\{B_i\}$:

$$\varepsilon(\rho(0))=\rho_f=\Sigma_{i=1}^{d^2} B_i \rho(0) B_i^\dagger = \Sigma_{m,n} X_{mn} \tilde{E}_m \rho(0) \tilde{E}_n^\dagger \quad (2)$$

d is a dimension of the system, $\{\tilde{E}_m, \tilde{E}_n\}$ is a complete set of basis vectors, and may include Pauli matrices, and $X_{mn}$ is a process matrix that describes all information of a specific quantum gate. A process matrix X can be determined from a specific quantity of the input quantum states and the corresponding output quantum states by using the mapping relationship. A value range of i in the formula (2) is an integer in a range $[1, d^2]$.

In some embodiments, the Powell algorithm is used to estimate the process matrix obtained through the QPT measurement to find the actual gate operator corresponding to the quantum gate. The Powell algorithm is an accelerated algorithm using a conjugate direction, and has a better optimization effect for a parameter dimension less than 20. For an objective function, a parameter vector in an N-dimensional space is $\vec{X}$. Starting from an initial guess value $\vec{X}_0^{(0)}$, in the $l^{th}$ iteration, there are N determined search directions $\{\vec{h}_1^{(l)}, \ldots, \vec{h}_N^{(l)}\}$ pre-existing in a parameter space. In the $k(\leq N)^{th}$ iteration, starting from $\vec{X}_{k-1}^{(l)}$, a one-dimensional search is performed along the direction $\vec{h}_k^{(l)}$ to minimize the objective function. After searches in all of the N directions are completed, a new direction is generated: $\vec{h}_{N+1}^{(l)} = \vec{X}_{N+1}^{(l)} - \vec{X}_0^{(l)}$, to replace one of the previous directions in $\{\vec{h}_k^{(l)}\}$. In the $(l+1)^{th}$ iteration, $\vec{X}_0^{(l+1)} = \vec{X}_{N+1}^{(l)}$ is selected as initial point, and a new set $\{\vec{h}_k^{(l+1)}\}$ is used as search directions to perform iteration until a termination condition is met. This is the most primitive Powell algorithm, and such a direction update method is prone to linear correlation in an iteration. Consequently, a search process is carried out in a reduced dimensional space, and therefore, an optimal convergence value cannot be found. In view of this, the modified Powell algorithm is later provided, the core of which is to introduce a Powell condition as a criterion for determining whether the search direction needs to be adjusted and how to adjust the search direction, so as to achieve better results.

Experimentally, the behavior of a quantum gate is completely described by the process matrix X, which can be obtained through the QPT. Due to quantum dissipation and some other error sources, $X_{exp}$ that is experimentally determined always deviates from an ideal value. Therefore, it is almost impossible to accurately calculate a time evolution operator U corresponding to the quantum gate. However, a fitting method can be adopted to find the best estimate $U_{exp}$ (which is referred to as "the actual gate operator corresponding to the quantum gate"), and the estimate will be used in an optimization solution based on a gate operator as experimental measurement feedback. By constructing a constant matrix M (whose dimension is $N^2 \times N^2$) with a Pauli matrix as a basis vector, a relationship between a super operator form $\mathcal{U}$ and a process matrix $\vec{X}$ of a vector form corresponding to a quantum gate can be established, that is $\vec{X} = M^{-1}\mathcal{U}$. $U_{exp}$ can be estimated relatively quickly by choosing the Powell algorithm. For a given quantum gate operator U, a parameter vector $\vec{X}$ in the N-dimensional space can be defined according to all of N independent elements $\{i\}$, that is, $\vec{X} \equiv \vec{X}(\{U_i\})$. The objective function is selected as a square difference between a process matrix corresponding to a quantum gate U and an experimental measurement value, that is, $F = \|X(U) - X_{exp}\|^2 = \|X(X) - X_{exp}\|^2$. The parameter vector $\vec{X}$ corresponding to the quantum gate U is optimized by the Powell algorithm to minimize the objective function, so as to find $U_{exp}$ which is closest to the process matrix $X_{exp}$ measured in an experiment.

In another exemplary embodiment, the actual measurement data includes an actual output density matrix corresponding to the quantum gate. In some embodiments, at least one selected input quantum state is obtained; the input quantum state is processed through the quantum gate to obtain an output quantum state; and QST is performed on the output quantum state to obtain the actual output density matrix corresponding to the quantum gate.

The quantum state can be determined by using a method of the QST. A basic principle of the QST is to project the quantum state to different directions through a series of revolving gates selected in advance. Based on probabilities measured in different projection directions and maximum likelihood estimation, a density matrix corresponding to the quantum state can be fitted. Therefore, by performing the QST on the output quantum state of the quantum gate, the actual output density matrix corresponding to the quantum gate can be obtained.

Step 230: Calculating a gradient corresponding to the control external field based on the actual measurement data and ideal data.

In the embodiments of this application, the gradient corresponding to the control external field is calculated based on the actual measurement data and ideal data, and then the control external field is updated according to the gradient. The ideal data is data used for reflecting an ideal characteristic of the foregoing quantum gate. For example, when the actual measurement data includes the actual gate operator corresponding to the quantum gate, the ideal data includes an ideal gate operator corresponding to the quantum gate. In another example, when the actual measurement data includes the actual output density matrix corresponding to the quantum gate, the ideal data includes an ideal output density matrix of the quantum gate. The foregoing ideal data (such as the ideal gate operator, and the ideal output density matrix) can be set in advance according to a design situation of the quantum gate. The gradient-constrained optimization algorithm has a faster optimization speed than an optimization algorithm without gradient constraints, thereby saving optimization costs.

In some embodiments, the step includes the following substeps:

1. Derive a gradient calculation formula according to an objective function and a waveform function corresponding to the control external field, the objective function being configured to measure a gap between the actual measurement data and the ideal data, and an optimization objective of the objective function being to minimize a value of the objective function; and 2. Calculate, by using the gradient calculation formula, the gradient corresponding to the control external field based on the actual measurement data and the ideal data.

The objective function is related to precision of the quantum gate, and the objective function can be constructed based on a manner of measuring the precision of the quantum gate. In addition, this application provides two solutions, one is an optimization solution based on a gate operator, and the other is an optimization solution based on a density matrix. Therefore, the corresponding objective functions and the corresponding gradient calculation formulas are different.

For the optimization solution based on the gate operator, the actual measurement data includes the actual gate operator corresponding to the quantum gate, and the objective function is:

$$\mathcal{F}_U = \|U_d^\dagger U_c - U_{CZ}\|^2 = 2 - Tr\{U_c^\dagger U_d U_{CZ}\} - Tr\{U_{CZ} U_d^\dagger U_c\} \tag{3}$$

The corresponding gradient calculation formula is:

$$k_{U,m} = \frac{\partial \mathcal{F}_U}{\partial \mu_{A;m}} = -Tr \tag{4}$$

$$\left\{ \frac{\partial U_c^\dagger}{\partial \mu_{A;m}} U_d U_{CZ} + U_c^\dagger \frac{\partial U_d}{\partial \mu_{A;m}} U_{CZ} + U_{CZ} \frac{\partial U_d^\dagger}{\partial \mu_{A;m}} U_c + U_{CZ} U_d^\dagger \frac{\partial U_c}{\partial \mu_{A;m}} \right\} \approx$$

$$-i\tau Tr\{Q_{c;m} U_c^\dagger U_d U_{CZ} - U_{CZ} U_d^\dagger U_c Q_{c;m} +$$

$$U_{CZ} Q_{d;m} U_d^\dagger U_c - U_c^\dagger U_d Q_{d;m} U_{CZ}\} =$$

$$2\tau \mathrm{Im} Tr\{Q_{c;m} (U_d^\dagger U_c)^\dagger U_{CZ}\} + 2\tau \mathrm{Im} Tr\{Q_{d;m} (U_d^\dagger U_c) U_{CZ}\}$$

$U_c$ represents a total time evolution operator corresponding to the quantum gate. $U_d$ represents a time evolution operator corresponding to the quantum gate without interbit coupling. $U_{CZ}$ represents an ideal gate operator corresponding to the quantum gate. $U_d^\dagger U_c$ is replaced by $U_{exp}$. $U_{exp}$ represents the actual gate operator corresponding to the quantum gate, $\tau = T/M$. $\mu_{A;m}$ represents the $m^{th}$ pulse waveform in a pulse waveform sequence obtained by dividing a control external field $\mu_A$ by time. $Q_{c;m}$ represents a calculated value of a coupling term corresponding to the $m^{th}$ pulse waveform. $Q_{d;m}$ represents a calculated value of a decoupling term corresponding to the $m^{th}$ pulse waveform. Im represents an imaginary component of a complex number. $\|\|^2$ represents a square of an Euler norm, $\|R\|^2 = Tr\{R^*R\}$. Tr{A} represents a trace of a matrix A, that is, a sum of diagonal elements.

For the optimization solution based on the density matrix, the actual measurement data includes the actual output density matrix corresponding to the quantum gate, and the objective function is:

$$\mathcal{F}_\rho = \|\rho_f - \rho_{ideal}\|^2 = \qquad (5)$$

$$Tr\{[\rho_f - \rho_{ideal}]^\dagger [\rho_f - \rho_{ideal}]\} \approx 2 - 2Tr\{\rho_{ideal}\rho_f\} \approx 2 - 2\rho_{ideal}^\dagger \rho_f = 2 - 2\rho_{ideal}^\dagger \mathcal{U}_d^{-1} \mathcal{U}_c \rho(0)$$

The corresponding gradient calculation formula is:

$$k_{\rho;m} = \frac{\partial \mathcal{F}_\rho}{\partial \mu_{A;m}} = -2\rho_{ideal}^\dagger \left[ \frac{\partial \mathcal{U}_d^{-1}}{\partial \mu_{A;m}} \mathcal{U}_c + \mathcal{U}_d^{-1} \frac{\partial \mathcal{U}_c}{\partial \mu_{A;m}} \right] \rho(0) = \qquad (6)$$

$$2i\tau [\rho_{ideal}^\dagger \mathcal{Q}_{c;m} \mathcal{U}_d^{-1} \mathcal{U}_c \rho(0) - \rho_{ideal}^\dagger \mathcal{Q}_{d;m} \mathcal{U}_d^{-1} \mathcal{U}_c \rho(0)]$$

$\rho_f$ represents an output density matrix corresponding to the quantum gate. $\rho$ideal represents an ideal output density matrix corresponding to the quantum gate. $\rho(0)$ represents an input density matrix corresponding to the quantum gate. $\mathcal{U}_c$ represents a time evolution super operator of a coupling term. $\mathcal{U}_d$ represents a time evolution super operator of a decoupling term. $\mathcal{U}_d^{-1} \mathcal{U}_c \rho(0)$ is replaced by $\rho_{f,exp}$. $\rho_{f,exp}$ represents an actual output density matrix corresponding to the quantum gate, $\tau = T/M$. $\mu_{A;m}$ represents the $m^{th}$ pulse waveform in a pulse waveform sequence obtained by dividing the control external field $\mu_A$ by time. $Q_{c;m}$ represents a calculated value of a coupling term corresponding to the $m^{th}$ pulse waveform. $Q_{d;m}$ represents a calculated value of a decoupling term corresponding to the $m^{th}$ pulse waveform. In the formula (6), i represents an imaginary unit.

Step 240: Update the control external field according to the gradient to obtain an updated control external field, the updated control external field being applied to the qubit corresponding to the quantum gate to optimize the precision of the quantum gate.

In some embodiments, an updated value is calculated according to the gradient and a learning rate; and an updated control external field is calculated according to a current control external field and updated value. For example, the updated value is obtained by multiplying the gradient and the learning rate, and then the updated value is added to the current control external field to obtain the updated control external field. The learning rate is an empirical constant.

In addition, in the embodiments of this application, the GRAPE algorithm can be used to optimize a quantum gate (a control external field). When the quantum gate does not meet an optimization end condition, the updated control external field is used as the current control external field, and execution is started again from step 220; and the optimization process is ended when the quantum gate meets the optimization end condition. In some embodiments, the optimization end condition includes at least one of the following: the actual characteristic of the quantum gate reflected by the actual measurement data reaches a set index, or a change of the control external field before and after the update is less than a set value.

In summary, the quantum gate optimization solution provided in this application is a closed-loop optimization solution driven and implemented by data feedback. By combining a gradient-constrained optimization algorithm with actual measurement data, on the one hand, due to the gradient-constrained optimization of the control external field, this application can shorten an optimization time and lower optimization costs compared with some optimization solution without gradient constraints, and on the other hand, because the actual measurement data of the quantum gate is acquired during optimizations, and optimization is performed by using the actual measurement data as feedback, this application ensures the effect and precision of optimization. With reference to the foregoing two aspects, this application achieves a quantum gate optimization solution that improves both the precision and efficiency.

Using a CZ gate as an example below, a process of optimizing the CZ gate by using the technical solution in this application is described.

1. Non-Adiabatic CZ Gate

When there is no control external field, a Hamiltonian of a two-bit system (A,B) can be written as:

$$H_0 \times H_A \otimes I_B + I_A \otimes H_B + H_{int} \qquad (7)$$

$H_{i=A,B}$ is a Hamiltonian of a single bit, $1_{i=A,B}$ is a unit operator, and $H_{int}$ represents interaction between two bits. The CZ gate is implemented by a second excited state of one of the bits. A form of a three-level single-bit Hamiltonian ($\hbar=1$, where $\hbar$ represents a reduced Planck constant, which is set to 1 in a natural unit system for convenience) is:

$$H_{i=A,B} = \omega_i |1_i\rangle \langle 1_i| + (2\omega_i + \Delta_i)|2_i\rangle \langle 2_i| \qquad (8)$$

For each bit (i=A, B), $\omega_i$ and $\Delta_i$ respectively represent a resonant frequency and an harmonicity of the bit. A parameter example of an experimental bit sample is provided herein, that is, $\omega_A/2\pi=5.176$ GHz, $\omega_B/2\pi=4.438$ GHz, and $\Delta_A/2\pi=-245.2$ MHz, $\Delta_B/2\pi=-255.5$ MHz.

In addition, an interaction Hamiltonian of the two-bit system (A,B) is:

$$H_{int} = g(a_A^+ \otimes a_B^- + a_A^- \otimes a_B^+) \qquad (9)$$

$a_{i=A,B}^+ = \Sigma_{j=0}^1 \sqrt{j+1} |(j+1)_i\rangle \langle j_i|$ and $a_{i=A,B}^- = \Sigma_{j=1}^2 \sqrt{j} |(j-1)_i\rangle \langle j_i|$ respectively represent a raising operator and a lowering operator, and g is coupling strength between the two bits. A parameter example of an experimental sample is $g/2\pi=8.5$ MHz.

Due to a weak coupling condition ($g \ll |\omega_A - \omega_B|$) between the two bits, when there is no control external field, a probability exchange between the two bits is basically negligible. However, when a control external field in a z direction is applied, a resonance environment can be created for the two bits. The control external field can be written as:

$$H_{ext}(t) = \mu_A(t) P_A \qquad (10)$$

$P_A = n_A \otimes I_B$, $n_A = \Sigma_{j=0}^2 j|j_A\rangle \langle j_A|$. $I_B$ indicates that no operation is applied to a bit B, which corresponds to an identity matrix. $P_A$ is a constant matrix with only diagonal elements. $|j_A\rangle$ and $\langle j_A|$ respectively represent basis vectors of a bit A, $|j_A\rangle$ is a right basis vector, and $\langle j_A|$ is a left basis vector. Therefore, a total coupling Hamiltonian is $H_c(t) = H_0(g) + H_{ext}(t)$. When the control external field is $\mu_A(t) = \mu_{A;\tau} = \omega_B - \omega_A - \Delta_A$, the two-bit system resonates between $|1_A 1_B\rangle$ and $|2_A 0_B\rangle$. For convenience of writing, any state $|j_A j'_B\rangle$ is abbreviated as $|jj'\rangle$ below, a letter in the first position represents the bit A, and a letter in the second position represents the bit B.

Under such a control external field, the two-bit system can also be reduced to a 5-level status for processing. In a simplified 5-level Hilbert space $\{|00\rangle, |10\rangle, |11\rangle 11\rangle, |20\rangle\}$, the Hamiltonian of the two-bit quantum system $H_c(t)$ can be expressed in the following form:

$$H_c(t) = 0|00\rangle \langle 00| + [\omega_A + \mu_A(t)]|10\rangle \langle 10| + \omega_B |01\rangle \langle 01| + [\omega_A + \mu_A(t) + \omega_B]|11\rangle \langle 11| + [2(\omega_A + \mu_A(t)) + \Delta_A]|20\rangle \langle 20| + \sqrt{2}g[|11\rangle \langle 20| + |20\rangle \langle 11|] \qquad (11)$$

The coupling between $|10\rangle$ and $|01\rangle$ is neglected here.

Under a resonance condition $\mu_A(t)=\mu_{A;r}=\omega_B-\omega_A-\Delta_A$, the foregoing Hamiltonian $H_c(t)$ can be abbreviated as:

$$H_c(t)=0|00\rangle\langle 00|+[\omega_A+\mu_{A;r}]|10\rangle\langle 10|+\omega_B|01\rangle\langle 01|+ \\ [\omega_A+\mu_{A;r}+\omega_B]|11\rangle\langle 11|+|20\rangle\langle 20|]+\sqrt{2}g[|11\rangle\langle 20|+|20\rangle\langle 11|] \quad (12)$$

In addition, an auxiliary Hamiltonian $H_d(t)$ without inter-qubit coupling (g=0) can be given by the following formula:

$$H_d(t)=0|00\rangle\langle 00|+[\omega_A+\mu_{A;r}]|10\rangle\langle 10|+\omega_B|01\rangle\langle 01|+ \\ [\omega_A+\mu_{A;r}+\omega_B]|11\rangle\langle 11|+|20\rangle\langle 20| \quad (13)$$

Next, time evolution operator, $U_c=\exp(-iH_cT)$ and $U_d=\exp(-iH_dT)$, are constructed, where i represents an imaginary unit. Coupling effect of the Hamiltonian $H_c$ given by the formula (12) only exists in $|11\rangle$ and $|20\rangle$. In a two-dimensional subspace formed by $|11\rangle$ and $|20\rangle$, two operators, $I_2 32 |11\rangle\langle 11|+|20\rangle\langle 20|$ and $X_2=|11\rangle\langle 20|+|20\rangle\langle 11|$. Therefore, the Hamiltonian in the 2×2 subspace can be written as:

$$H_{sub}=[\omega_A+\mu_{A;r}+\omega_B]I_2+\sqrt{2}gX_2 \quad (14)$$

In a time T, a corresponding time evolution operator can be written as:

$$U_{sub}=e^{-i(\phi_A+\phi_B)}\exp(-i\sqrt{2}gTX_2) \quad (15)$$

$\phi_A=(\omega_A+\mu_{A;r})T$, $\phi_B=\omega_B T$, and i represents an imaginary unit. The second term on the right side of the formula (15) is a rotation operator, which can be expanded into:

$$\exp(-i\sqrt{2}gTX_2)=\cos(\sqrt{2}gT)I_2-i\sin(\sqrt{2}gT)X_2 \quad (16)$$

When the evolution time is a half period, that is, $T=\pi/\sqrt{2}g$, the time evolution operator of the two-dimensional subspace can be written as:

$$U_{sub}=-e^{-i(\phi_A+\phi_B)}I_2=-e^{-i(\phi_A+\phi_B)}[|11\rangle\langle 11|+|20\rangle\langle 20|] \quad (17)$$

Therefore, the total time evolution operator is:

$$U_c=|00\rangle\langle 00|+e^{-i\phi_A}|10\rangle\langle 10|+e^{-i\phi_B}|01\rangle\langle 01|-e^{i(\phi_A+\phi_B)} \\ [|11\rangle\langle 11|+|20\rangle\langle 20|] \quad (18)$$

In addition, a time evolution operator without coupling is:

$$U_d=|00\rangle\langle 00|+e^{-i\phi_A}|10\rangle\langle 10|+ \\ e^{-i\phi_B}|01\rangle\langle 01|+e^{-i(\phi_A+\phi_B)}[|11\rangle\langle 11|+|20\rangle\langle 20|] \quad (19)$$

A time evolution operator with a trivial dynamic phase removed is:

$$U_{CZ}=U_d^\dagger U_c=|00\rangle\langle 00|+|10\rangle\langle 10|+|01\rangle\langle 01|- \\ |11\rangle\langle 11|-|20\rangle\langle 20| \quad (20)$$

When an initial state is only in a subspace $\{|00\rangle, |10\rangle, |01\rangle, |11\rangle\}$, the last term on the right side of the formula (20) is negligible, and the time evolution operator is an ideal CZ gate.

2. Optimization Solution Based on a Gate Operator

Due to inevitable errors in an evolution process, a simple square pulse ($\mu_A(0<t<T)=\mu_{A;r}$) as a control external field cannot produce a high-fidelity CZ gate. Therefore, a form of a control external field $\mu_A(t)$ needs to be modified. In this case, two Hamiltonians, $H_c(t)$ and $H_d(t)$ are time-dependent, and corresponding time evolution operators need to become $U_c(t)=T_+\exp[-i\int_0^T H_c(t)dt]$ and $U_d(t)=T_+\exp[-i\int_0^T H_d(t)dt]$. $T_+$ represents a forward propagation timing operator, and i represents an imaginary unit. For convenience, the time T is divided into M parts ($\tau=T/M$), and the control external field $\mu_A(t)$ is discretized as:

$$\mu_A(t)\Rightarrow\{\mu_{A;1}=\mu_A(t=0), \mu_{A;2}=\mu_A(\tau), \ldots, \mu_{A;M}=\mu_A((M-1)\tau)\} \quad (21)$$

The Hamiltonian $H_c(t)$ can be discretized into:

$$H_{c;m=1,2,\ldots,M}=0|00\rangle\langle 00|+[\omega_A+\mu_{A;m}]|10\rangle\langle 10|+ \\ \omega_B|01\rangle\langle 01| \\ +[\omega_A+\mu_{A;m}+\omega_B]|11\rangle\langle 11|+[2(\omega_A+\mu_{A;m})+\Delta_A]|20\rangle\langle 20|+\sqrt{2}g[|11\rangle\langle 20|+|20\rangle\langle 11|] \quad (22)$$

The decoupling Hamiltonian $H_d(t)$ can be discretized into:

$$H_{d;m=1,2,\ldots,M}=0|00\rangle\langle 00|+[\omega_A+\mu_{A;m}]|10\rangle\langle 10|+ \\ \omega_B|01\rangle\langle 01| \\ +[\omega_A+\mu_{A;m}+\omega_B]|11\rangle\langle 11|+[2(\omega_A+\mu_{A;m})+\Delta_A]|20\rangle\langle 20| \quad (23)$$

The corresponding two time evolution operators become:

$$U_c=U_{c;M}U_{c;M-1}\cdots U_{c;2}U_{c;1} \quad (24)$$

$$U_d=U_{d;M}U_{d;M-1}\cdots U_{d;2}U_{d;1} \quad (25)$$

$U_{c;m}=\exp(-iH_{c;m}\tau)$, $U_{d;m}=\exp(-iH_{d;m}\tau)$, i represents an imaginary unit, and the time evolution operator $U=U_d^\dagger U_c$ with a trivial dynamic phase removed is a CZ gate $U_{cz}$ that needs to be optimized.

In the optimization solution based on the gate operator, an objective function is defined as:

$$\mathcal{F}_U=\|U_d^\dagger U_c-U_{CZ}\|^2=2-Tr\{U_c^\dagger U_d U_{CZ}\}- \\ Tr\{U_{CZ}^\dagger U_d^\dagger U_c\} \quad (26)$$

Due to discretization of the control external field $\mu_A(t)$, $\mathcal{F}_U$ is a function of all pulse amplitudes, that is, $\mathcal{F}_U=\mathcal{F}_U(\mu_{A;1}, \mu_{A;2}, \ldots, \mu_{A;M})$. For the $m^{th}$ amplitude $\mu_{A;m}$, a gradient of the objective function is:

$$k_{U,m}=\frac{\partial \mathcal{F}_U}{\partial \mu_{A;m}}= \\ -Tr\left\{\frac{\partial U_c^\dagger}{\partial \mu_{A;m}}U_d U_{CZ}+U_c^\dagger \frac{\partial U_d}{\partial \mu_{A;m}}U_{CZ}+U_{CZ}\frac{\partial U_d^\dagger}{\partial \mu_{A;m}}U_c+U_{CZ}U_d^\dagger\frac{\partial U_c}{\partial \mu_{A;m}}\right\} \quad (27)$$

An optimization condition is given by $\partial \mathcal{F}_U/\partial\mu_{A;m}=0$, where m=1,2,..., M. To meet the optimization condition, the gradient in the formula (27) is further expanded. Partial derivatives of the $U_c$ part are:

$$\frac{\partial U_c}{\partial \mu_{A;m}}=U_{c;M}\cdots U_{c;m+1}\frac{\partial U_{c;m}}{\partial \mu_{A;m}}U_{c;m-1}\cdots U_{c;1} \quad (28)$$

To calculate $\partial U_{c;m}/\partial\mu_{A;m}$, the time evolution operator needs to be expanded as:

$$U_{c;M}=I-\tau H_{c;m}-\tau^2 H_{c;m}^2/2- \quad (29)$$

In addition, the result is applied:

$$\frac{\partial H_{c;m}^n}{\partial \mu_{A;m}}=\frac{\partial H_{c;m}}{\partial \mu_{A;m}}H_{c;m}^{n-1}+H_{c;m}\frac{\partial H_{c;m}}{\partial \mu_{A;m}}H_{c;m}^{n-2}+\ldots \quad (30)$$

Under a normal circumstance, $\partial H_{c;m}/\partial\mu_{A;m}$ and $H_{c;m}$ are not mutually exclusive. For numerical calculations, this application uses an acceptable approximation:

$$\frac{\partial H_{c;m}^n}{\partial \mu_{A;m}} \approx n \frac{\partial H_{c;m}}{\partial \mu_{A;m}} H_{c;m}^{n-1} \tag{31}$$

Using the result, the formula (28) can be simplified into:

$$\frac{\partial U_c}{\partial \mu_{A;m}} \approx -i\tau U_{c;M} \ldots U_{c;m+1} \frac{\partial H_{c;m}}{\partial \mu_{A;m}} U_{c;m} U_{c;m-1} \ldots U_{c;1} \tag{32}$$

Two variables, $P_A = \partial H_{c;m}/\partial \mu_{A;m} = n_A \otimes I_B$ and $R_{c;m} = U_{c;m} U_{c;m-1} \ldots U_{c;1}$, are introduced, so that the formula (32) can be rewritten as:

$$\frac{\partial U_c}{\partial \mu_{A;m}} \approx -i\tau U_c R_{c;m}^\dagger P_A R_{c;m} = -i\tau U_c Q_{c;m} \tag{33}$$

$Q_{c;m}$ represents a calculated value of a coupling term corresponding to the $m^{th}$ pulse waveform, $Q_{c;m} = R_c^\dagger P_A R_{c;m}$. A partial derivative of $U_d$ can be obtained using the same method, which is:

$$\frac{\partial U_d}{\partial \mu_{A;m}} \approx -i\tau U_c Q_{d;m} \tag{34}$$

$Q_{d;m}$ represents a calculated value of a decoupling term corresponding to the $m^{th}$ pulse waveform, $Q_{d;m} = R_{d;m}^\dagger P_A R_{d;m}$, $R_{d;m} = U_{d;m} U_{d;m-1} \ldots U_{d;1}$. The formula (33) and the formula (34) are substituted into the formula (27) to obtain:

$$k_{U;m} \approx -i\tau Tr \tag{35}$$
$$\{Q_{c;m} U_c^\dagger U_d U_{CZ} - U_{CZ} U_d^\dagger U_c Q_{c;m} + U_{CZ} Q_{d;m} U_d^\dagger U_c - U_c^\dagger U_d Q_{d;m} U_{CZ}\}$$
$$= 2\tau \mathrm{Im} Tr\{Q_{c;m}(U_d^\dagger U_c)^\dagger U_{CZ}\} + 2\tau \mathrm{Im} Tr\{Q_{d;m}(U_d^\dagger U_c) U_{CZ}\}$$

Im represents an imaginary component of a complex number, and i represents an imaginary unit.

Figure 3:
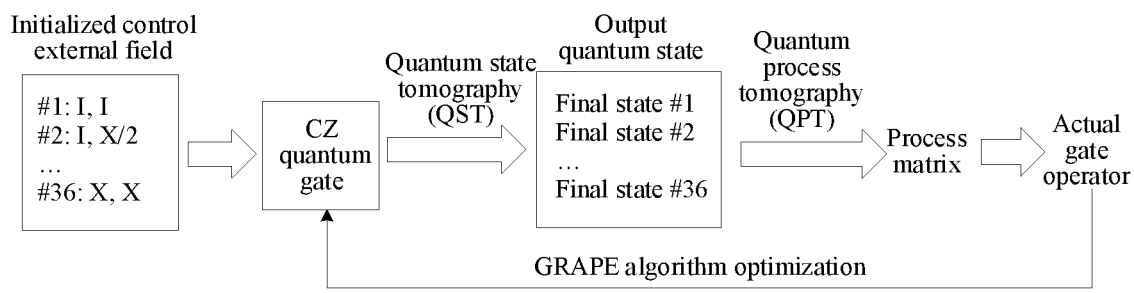
FIG. 3 is a schematic diagram of an optimization solution based on a gate operator according to this application.

Because it is very difficult to solve $$k_{U,m=1,2,\ldots,M} = \frac{\partial \mathcal{F}_U}{\partial \mu_{A;m}} = 0$$

directly analytically, this application uses a GRAPE method based on iterative updating, and a process thereof is shown in FIG. 3. The solution starts from an initial guess waveform (for example, a flattop waveform or another suitable waveform can be selected experimentally), $\mu_A^{(0)} = \{\mu_{A;1}^{(0)}, \ldots, \mu_{A;M}^{(0)}\}$. In the $l^{th}$ iteration step, a gradient in the step is calculated numerically, $k_U^{(l)} = \{k_{U,1}^{(l)}, \ldots, k_{U,M}^{(l)}\}$, and is then iterated through linear propagation:

$$\mu_{A;m}^{(l+1)} = \mu_{A;m}^{(l)} + \alpha_U k_{U,m}^{(l)} \tag{36}$$

where a learning rate $\alpha_U$ is an empirical constant updated through a series of iterations:

$$\ldots \to \mu^{(l)} \to k^{(l)} \to \mu^{(l+1)} \to \ldots,$$

so that the gradient $k_U^{(l)} \approx 0$, which means that the waveform is close to an optimal value $\mu_{opt}$, and basically does not change any more ($\mu_A^{(l+1)} \mu_A^{(l)}$). However, first, the formula (36) is just the simplest model, and other more complex models may alternatively be chosen; second, for high-dimensional optimization problems, it is also very important to choose an initial value; third, although the optimized waveform can be obtained purely through numerical calculations, such a waveform does not necessarily lead to a high-precision CZ gate in an actual experiment since there are often some uncontrollable errors in the experiment.

Therefore, this application provides adoption of a data-driven method to partially avoid the foregoing third problem. The term "partially avoid" here means that some parameters in the experiment, such as a coupling strength calibration error and a waveform generation error, can be minimized through optimization as much as possible. However, inherent defects of a bit, such as an excessively short decoherence time, cannot be prevented. Experimentally, a feasible way is to use the Powell algorithm to estimate a process matrix measured through QPT, so as to find the actual gate operator $U_{exp}$. Therefore, in the $l^{th}$ iteration step, the formula (35) can be changed to:

$$k_{U;m}^{(l)} \approx 2\tau \mathrm{Im} Tr\{Q_{c;m}^{(l)}(U_{exp}^{(l)})^\dagger U_{CZ}\} + 2\tau \mathrm{Im} Tr\{Q_{d;m}^{(l)} U_{exp}^{(l)} U_{CZ}\} \tag{37}$$

This is, the gradient in combination with feedback of experimental measurement data is updated by using the experimental results, and therefore, converges more effectively, thereby improving the final precision of the quantum gate.

3. Lindblad Master Equation and Representation Thereof in a Liouville Space

In view of dissipation, the time evolution of a density matrix is represented by a Lindblad master equation:

$$\rho(t) = -i[H(t), \rho(t)] + \Sigma_s (L_s \rho(t) L_s^\dagger - \tfrac{1}{2}\{\rho(t), L_s^\dagger L_s\}) \tag{38}$$

H (t) is a total system Hamiltonian, and $\{L_s\}$ is a set of Lindblad operators representing dissipation. For two arbitrary operators, A and B in a Hilbert space, [A, B]=AB−BA, and {A, B}=AB+BA, which are respectively expressed as a commutation relationship and an anti-commutation relationship, where i represents an imaginary unit.

To facilitate derivation and numerical calculations, concepts of the Liouville space and the Liouville super operator are introduced. In the Hilbert space with $\{|i\rangle\}$ as a basis vector group, an expanded form of the density matrix is:

$$\rho = \sum_{i,j} \rho_{ij} |i\rangle\langle j| \tag{39}$$

In the Liouville space, the foregoing matrix is converted into a vector form:

$$\rho = \sum_{i,j} \rho_{ij} |i, j\rangle\rangle \tag{40}$$

The foregoing formula is defined in a new basis vector group $\{|i, j\rangle\rangle\}$, and there is a one-to-one correspondence $|i, j\rangle\rangle \Leftrightarrow |i\rangle\langle j|$. A complex conjugate term $|i,j\rangle\rangle^\dagger = \langle\langle i, j| \Leftrightarrow |j\rangle\langle i|$ thereof is introduced, and an inner product form thereof is:

$$\langle\langle i, j | i', j' \rangle\rangle = Tr\{|j\rangle\langle i|i'\rangle\langle j'|\} = \delta_{i,i'} \delta_{j,j'} \tag{41}$$

An outer product form is: $|i,j\rangle\rangle\langle\langle k,l|$. A unit operator (matrix) in the Liouville space can be expanded into:

$$\mathcal{J} = \Sigma_{i,j} |i,j\rangle\rangle\langle\langle i,j| \tag{42}$$

Then, an arbitrary Liouville super operator $\mathcal{L}$ is constructed, and a matrix form of which is as follows:

$$\mathcal{L} = \Sigma_{i,j;k,l} \mathcal{L}_{i,j;k,l} |i,j\rangle\rangle\langle\langle k,l| \qquad (43)$$

$\mathcal{L}_{i,j;k,l} = \langle\langle i,j|\mathcal{L}|k,l\rangle\rangle$. To illustrate the application of the Liouville super operator, two examples are provided below.

(a) Commutator of a system Hamiltonian

For a general N-dimensional Hilbert space, the system Hamiltonian may be expanded to $H = \Sigma_{i,j} H_{i,j} |i\rangle\langle j|$. In the Hilbert space, the commutator is written as:

$$H\rho - \rho H = \Sigma_{i,j,k}(H_{i,k}\rho_{k,j} - \rho_{i,k}H_{k,j})|i\rangle\langle j| = \Sigma_{i,j,k,l}(H_{i,k}\delta_{j,l} - H_{l,j}\delta_{i,k})\rho_{k,l}|i\rangle\langle j| \qquad (44)$$

The formula (40) and formula (41) are applied, and the foregoing formula in the Liouville space can be rewritten as:

$$L_{sys}\rho = H\rho - \rho H \qquad (45)$$
$$= \left[\sum_{i,j,k,l}(H_{i,k}\delta_{j,l} - H_{l,j}\delta_{i,k})|i,j\rangle\rangle\langle\langle k,l|\right]\left[\sum_{k',l'}\rho_{k',l'}|k',l'\rangle\rangle\right]$$

Therefore, a matrix form of the commutation relationship of the system Hamiltonian is as follows:

$$L_{sys} = \sum_{i,j,k,l}(H_{i,k}\delta_{j,l} - H_{l,j}\delta_{i,k})|i,j\rangle\rangle\langle\langle k,l| \qquad (46)$$

(b) Dissipation caused by a Lindblad operator $L_s$

A dissipation term of the Lindblad equation in the formula (38) can be expanded as:

$$\mathcal{L}_s\rho = L_s\rho L_s^\dagger - \frac{1}{2}\{\rho, L_s^\dagger L_s\} = \qquad (47)$$
$$\sum_{i,j,k,l}\left[L_{s;i,k}\rho_{k,l}L_{s;l,j}^\dagger - \frac{1}{2}\rho_{i,k}(L_s^\dagger L_s)_{k,j} - \frac{1}{2}(L_s^\dagger L_s)_{i,k}\rho_{k,j}\right]|i\rangle\langle j| \Rightarrow$$
$$\sum_{i,j,k,l}\left[L_{s;i,k}L_{s;l,j}^\dagger - \frac{1}{2}(L_s^\dagger L_s)_{l,j}\delta_{i,k} - \frac{1}{2}(L_s^\dagger L_s)_{i,k}\delta_{l,j}\right]\rho_{k,l}|i,j\rangle\rangle$$

The corresponding Liouville super operator is written as:

$$\mathcal{L}_s = \Sigma_{i,j,k,l}[L_{s;i,k}L_{s;i,k}^\dagger - 1/2(L_s^\dagger L_s)_{i,j}\delta_{i,k} - 1/2(L_s^\dagger L_s)_{i,k}\delta_{l,j}]|i,j\rangle\rangle\langle\langle k,l| \qquad (48)$$

For an energy relaxation part of a single qubit (N≥2), the Lindblad operator is written as:

$$L_{relax} = \sum_j \sqrt{\frac{j}{T_1}}|j-1\rangle\langle j| \qquad (49)$$

The corresponding Liouville super operator is written as:

$$\mathcal{L}_{relax} = \sum_{k,j,k,l}\frac{1}{T_1}\left[\sqrt{kl}\,\delta_{i+1,k}\delta_{j+1,l} - \frac{1}{2}(i+l)\delta_{i,k}\delta_{j,l}\right]|i,j\rangle\rangle\langle\langle k,l| \qquad (50)$$

For a phase relaxation part of a single qubit, the Lindblad operator is written as:

$$L_{deph} = \sum_j \sqrt{\frac{2}{T_\phi}}\,j|j\rangle\langle j| \qquad (51)$$

The corresponding Liouville super operator is written as:

$$\mathcal{L}_{deph} = \sum_{k,j,k,l} -\frac{1}{T_\phi}(i-l)^2\delta_{i,k}\delta_{j,l}|i,j\rangle\rangle\langle\langle k,l| \qquad (52)$$

In summary, the Liouville super operator corresponding to a total dissipation term of a single qubit is:

$$\mathcal{L}_{diss} = \sum_{k,j,k,l}\left[\frac{1}{T_1}\sqrt{kl}\,\delta_{i+1,k}\delta_{j+1,l} - \left(\frac{(i-l)^2}{T_\phi} + \frac{(i+l)}{2T_1}\right)\delta_{i,k}\delta_{j,l}\right]|i,j\rangle\rangle\langle\langle k,l| \qquad (53)$$

A specific form of the Liouville super operator is substituted into the Lindblad equation, a matrix equation that the density matrix evolves with time will be obtained, and the form is as follows:

$$\dot{\rho}(t) = -i\mathcal{L}(t)\rho(t) \qquad (54)$$

The total Liouville super operator $\mathcal{L}(t)$ includes a system part $\mathcal{L}_{sys}(t)$ and a dissipative part $\mathcal{L}_{diss}$, that is $\mathcal{L}(t) = \mathcal{L}_{sys}(t) + i\mathcal{L}_{diss}$. A solution to the formula (50) is:

$$\rho(T) = \mathcal{U}(T)\rho(0), \mathcal{U}(T) = T_+ \exp[-i\int_0^T \mathcal{L}(t)dt] \qquad (55)$$

$\mathcal{U}(T)$ is a super operator about that a density matrix in the Liouville space evolves with time, and i represents an imaginary unit.

4. Optimization Solution Based on a Density Matrix

Another optimization solution provided in this application is implemented based on the formula (54) and the formula (55). For a two-qubit system in an experiment, either a 5-dimensional Hilbert space with $\{|00\rangle, |10\rangle, |01\rangle, |11\rangle, |20\rangle\}$ as a basis vector or a more comprehensive 9-dimensional Hilbert space with $\{|i_A(=0,1,2)i_B(=0,1,2)\rangle\}$ as a basis vector can be considered. Similar to a processing method of the solution 1, the solution also introduces two Hamiltonians, $H_c(t) = H_0(g) + H_{ext}(\mu_A(t))$ and $H_d(t) = H_0(g=0) + H_{ext}(\mu_A(t))$, and correspondingly two Liouville super operators $\mathcal{L}_c(t)$ and $\mathcal{L}_d(t)$ are constructed. By measuring dynamic phases $\phi_A(T)$ and $\phi_B(T)$, additional operators on $H_d(t)$ can be effectively obtained. Therefore, $\mathcal{L}_c(t)$ includes a dissipation term, and $\mathcal{L}_d(t)$ does not include a dissipation term. In addition, discretization of an external field, that is, $\mu_A(t) \Rightarrow \{\mu_{A;2}, \mu_{A;2}, \ldots, \mu_{A;M}\}$, produces two sets of Liouville super operators, forms of which are as follows:

$$\mathcal{L}_c(t) \Rightarrow \{\mathcal{L}_{c;1}, \mathcal{L}_{c;2}, \ldots, \mathcal{L}_{c;M}\} \qquad (56)$$

$$\mathcal{L}_d(t) \Rightarrow \{\mathcal{L}_{d;1}, \mathcal{L}_{d;2}, \ldots, \mathcal{L}_{d;M}\} \qquad (57)$$

The forms of the two time evolution super operators are as follows:

$$\mathcal{U}_c = \mathcal{U}_{c;M}\mathcal{U}_{c;M-1}\ldots\mathcal{U}_{c;2}\mathcal{U}_{c;1} \qquad (58)$$

$$\mathcal{U}_d = \mathcal{U}_{d;M}\mathcal{U}_{d;M-1}\ldots\mathcal{U}_{d;2}\mathcal{U}_{d;1} \qquad (59)$$

In the foregoing formula, $\mathcal{U}_c$ represents the time evolution super operator of a coupling term, and $\mathcal{U}_d$ represents the time evolution super operator of a decoupling term:

$$\mathcal{U}_{c;m} = \exp[-i\mathcal{L}_{c;m}\tau] \quad (60)$$

$$\mathcal{U}_{d;m} = \exp[-i\mathcal{L}_{d;m}\tau] \quad (61)$$

Each short period of time is $\tau=T/M$, and i represents an imaginary unit.

In the optimization solution based on a density matrix, a particular initial state can be selected, for example, $\phi(0) = (|0\rangle+|1\rangle)\otimes(|0\rangle-|1\rangle)/2$ and $\rho(0)=\phi(0)\phi^\dagger(0)$, and whether a final state $\rho_f(T) = \mathcal{U}_d^{-1}\mathcal{U}_c\rho(0)$ is consistent with an ideal result $\rho_{ideal} = U_{CZ}\rho(0)U_{CZ}^\dagger$ is checked. In the Hilbert space, this application introduces an objective function:

$$\mathcal{F}_\rho = \|\rho_f - \rho_{ideal}\|^2 = Tr\{[\rho_f - \rho_{ideal}]^\dagger[\rho_f - \rho_{ideal}]\} \approx 2 - 2Tr\{\rho_{ideal}\rho_f\} \quad (62)$$

$\rho_f^\dagger = \rho_f$ is applied to derivation of the formula (62) $\rho_{ideal}^\dagger = \rho_{ideal}$; and $Tr\{\rho_{ideal}^2\} = 1$. An actual final state is usually a mixed state, but in the experiments, a weak dissipation condition leads to a better approximation, that is $Tr\{\rho_f^2\} \approx 1$. Next, the formula (62) is converted into an inner product form in the Liouville space:

$$\mathcal{F}_\rho \approx 2 - 2\rho_{ideal}^\dagger \rho_f = 2 - 2\rho_{ideal}^\dagger \mathcal{U}_d^{-1} \mathcal{U}_c \rho(0) \quad (63)$$

Similarly, a condition $\{\partial \mathcal{F}_\rho/\partial\mu_{A;m=1,2,\ldots,M}=0\}$ is used for controlling minimization of $\mathcal{F}_\rho$. For the $m^{th}$ pulse amplitude, a corresponding gradient is:

$$k_{\rho;m} = \frac{\partial \mathcal{F}_\rho}{\partial \mu_{A;m}} = -2\rho_{ideal}^\dagger \left[\frac{\partial \mathcal{U}_d^{-1}}{\partial \mu_{A;m}}\mathcal{U}_c + \mathcal{U}_d^{-1}\frac{\partial \mathcal{U}_c}{\partial \mu_{A;m}}\right]\rho(0) \quad (64)$$

The following approximation is used:

$$\partial \mathcal{U}_{c;m}/\partial\mu_{A;m} \approx -i\tau(\partial \mathcal{L}_{c;m}/\partial\mu_{A;m})\mathcal{U}_{c;m} \quad (65)$$

$$\partial \mathcal{U}_{d;m}^{-1}/\partial\mu_{A;m} \approx i\tau\mathcal{U}_{d;m}^{-1}(\partial \mathcal{L}_{d;m}/\partial\mu_{A;m}) \quad (66)$$

In addition, the condition 67 $\mathcal{L}_{c;m}/\partial\mu_{A;m} = \partial \mathcal{L}_{d;m}/\partial\mu_{A;m} = \mathcal{P}_A$ is used, where $\mathcal{P}_A = [n_A \otimes I_B, \ldots]$, and the formula (64) is simplified to:

$$k_{\rho;m} = 2i\tau[\rho_{ideal}^\dagger \mathcal{Q}_{c;m}\mathcal{U}_d^{-1}\mathcal{U}_c\rho(0) - \rho_{ideal}^\dagger \mathcal{Q}_{d;m}\mathcal{U}_d^{-1}\mathcal{U}_c\rho(0)] \quad (67)$$

In the foregoing formula, $Q_{c;m}$ represents a calculated value of a coupling term corresponding to the $m^{th}$ pulse waveform, $Q_{d;m}$ represents a calculated value of a decoupling term corresponding to the $m^{th}$ pulse waveform, and i represents an imaginary unit:

$$\mathcal{Q}_{c;m} = \mathcal{R}_{c;m}^{-1}\mathcal{P}_A\mathcal{R}_{c;m} \quad (68)$$

$$\mathcal{Q}_{d;m} = \mathcal{R}_{d;m}^{-1}\mathcal{P}_A\mathcal{R}_{d;m} \quad (69)$$

and $$\mathcal{R}_{c;m} = \mathcal{U}_{c;m+1}^{-1}\ldots\mathcal{U}_{c;M}^{-1}\mathcal{U}_d \quad (70)$$

$$\mathcal{R}_{d;m} = \mathcal{U}_{d;m}\ldots\mathcal{U}_{d;1} \quad (71)$$

Two items in brackets on the right side of the equation in the formula (67) are pure imaginary numbers, so that it is ensured that a gradient $k_{\rho;m}$ is a real number.

Figure 4:
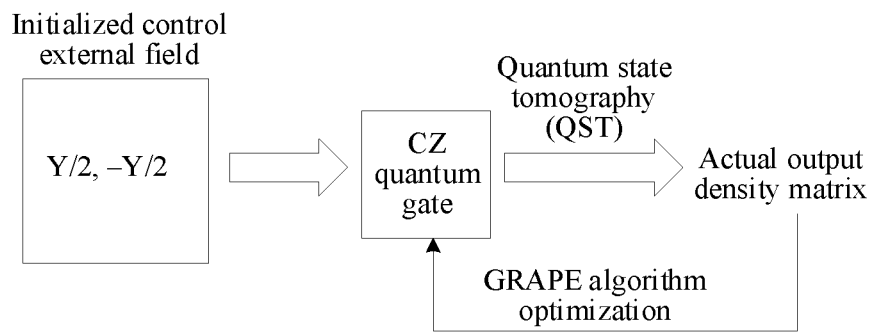
FIG. 4 is a schematic diagram of an optimization solution based on an output density matrix according to this application.

Similarly, an optimized condition $$k_{\rho,m=1,2,\ldots,M} = \frac{\partial \mathcal{F}_\rho}{\partial \mu_{A;m}} = 0$$

needs to be obtained through the GRAPE method, as shown in FIG. 4. The same idea as the first solution is used, starting from an initial guess waveform $\mu_A^{(0)}$, the update is performed through a linear iteration based on the gradient. In the $l^{th}$ iteration step, there is also:

$$\mu_{A;m}^{(l+1)} = \mu_{A;m}^{(l)} + \alpha_\rho k_{\rho,m}^{(l)} \quad (72)$$

A learning rate $\alpha_\rho$ is an empirical constant.

When a waveform converges near an optimal value, $k_\rho^{(l)} \approx 0$, that is, $\mu_A^{(l+1)} \approx \mu_A^{(l)}$. Similarly, experimentally, it is necessary to introduce data measured in an experiment for feedback. In the $l^{th}$ iteration, when an actual output density matrix measured in the experiment is $\rho_{f,exp}^{(l)}$, a form of the gradient in the formula (67) can be rewritten as:

$$k_{\rho;m}^{(l)} = 2i\tau[\rho_{ideal}^\dagger \mathcal{Q}_{c;m}^{(l)}\rho_{f,exp}^{(l)} - \rho_{ideal}^\dagger \mathcal{Q}_{d;m}^{(l)}\rho_{f,exp}^{(l)}] \quad (73)$$

The gradient in the formula (73) is also mixed with experimental information, and therefore, the optimal value of the waveform can be found more effectively.

In addition, for selection of an initial control external field, the following methods may be used. A control pulse of the CZ gate can be designed as a function with different waveforms. It is usually necessary to select a relatively smooth waveform to reduce a filtering effect existing in a circuit. For a waveform with a fast rise time (such as a square wave), the filtering effect in the circuit is equivalent to performing a Fourier transform on a square wave on a spectrum. Because a high-order harmonic spectrum of the square wave is very wide, a very large range of the spectrum is affected. However, for a relatively smooth waveform, an affected spectrum is relatively narrow. Therefore, a smooth waveform is less affected by filtering. An example of a flattop waveform is provided, of which a function form is:

$$\mu(t) = \frac{\Gamma}{2}\left\{\text{erf}\left(\frac{4\sqrt{\ln 2}}{\sigma}[t-(t_0+\sigma)]\right) - \text{erf}\left(\frac{4\sqrt{\ln 2}}{\sigma}[t-(t_0+T-\sigma)]\right)\right\} \quad (74)$$

erf(x) is a Gaussian error function, defined as $$\text{erf}(x) = \frac{2}{\sqrt{\pi}}\int_0^x e^{-\tau^2}d\tau.$$

A parameter $t_0=0$ represents a start time, $\Gamma$ and T respectively represent an amplitude and a time length of a pulse of an initialized control external field, $\sigma$ is related to the curvature of an edge of the pulse, and $t \geq 0$. Initially selected parameters of an experimental example are $\Gamma=-492.5/2$ $\pi$MHz, T=52 ns, and $\sigma=3$ ns.

In addition, in some other embodiments, considering that there are some determinate errors in a real quantum system, a more complex model can be established, to take specific forms of the actual error effects (such as the filtering effect) into consideration in the Hamiltonian of the system, to obtain a more precise gradient.

In some other embodiments, to correct an obtained gradient, with reference to an actual system, some boundary conditions can be given, or some gradient correction algorithms (such as the gradient correction in the Adam algorithm commonly used in deep learning) can be used in an iteration using the GRAPE algorithm.

In some other embodiments, the GRAPE algorithm is combined with other algorithms. After the gradient cannot guide an effective update of the control external field, an optimized control external field is used as the initial control external field and passed into other algorithms, and some new parameters can be selected for optimization.

Next, experimental implementation of two optimization solutions in an SC qubit system is described.

(a) Experimental method of an optimization solution based on a gate operator

By using the foregoing optimization solution based on a gate operator, a CZ gate can be optimized experimentally. A specific implementation is as follows. As shown in FIG. 3, through the operations of $\{I, X, \pm Y/2, \pm X/2\}$, two bits are each prepared to 6 different initial states, and there is a total of 36 initial states. In the $l^{th}$ iteration step, a particular pulse $\mu_A^{(l)}(t)$ is applied to a target bit. A relatively smooth flattop waveform is selected as an initial waveform $\mu_A^{(0)}(t)$, and the amplitude thereof is near a resonance point $\mu_{A;r}$, a total time T=52 ns is slightly longer than a resonance period, and σ=3 ns is selected as the curvature of an edge. For each initial state, a final state after passing through the CZ gate is measured through QST. When an input state is ρ(0), an output state $\rho_f$ is given in a form of the formula (2) $\rho_f^{(l)} = \Sigma_{m,n} X_{mn}^{(l)} \tilde{E}_m \rho(0) \tilde{E}_n^\dagger$. A process matrix $x^{(l)} = \{X_{mn}^{(l)}\}$ can be obtained by analyzing 36 input quantum states and corresponding output quantum states. For QST measurement results, it is necessary to read and correct quantum state preparation errors and measurement errors. To quantitatively express the precision of the CZ gate, $F(X^{(l)})=Tr\{(X^{(l)})^\dagger X_{ideal}\}$ is defined, where $X_{ideal}$ represents a process matrix corresponding to an ideal CZ gate. The precision of an initial flattop waveform is generally poor, and the control waveform needs to be optimized.

For such an optimization solution based on a gate operator, the gate operator $U_{exp}^{(l)}$ in an experiment needs to be used in an iteration process. However, experimentally, the process matrix $X^{(l)}$ is obtained through the QPT measurement. Therefore, it is necessary to find the corresponding $U_{exp}^{(l)}$. Using the Powell algorithm introduced earlier, $U_{exp}^{(l)}$ can be well estimated. Experimentally, trivial dynamic phases of two bits, $\phi_A$ and $\phi_B$ can be calibrated by using the Ramsey method and compensated for a quantum gate operation after $\mu_A^{(l)}(t)$. Therefore, $U_{exp}^{(l)}$ obtained by analyzing the QPT result automatically includes an auxiliary operator $(U_d^{(l)})^\dagger$ without coupling interaction. Because a real system includes a lot of extra noise, the CZ gate is not completely unitary. The precision still needs to be measured by using the process matrix $X^{(l)}$, but the best estimate, $U_{exp}^{(l)}$, in the iteration process still has a very important guiding significance for the rise of the precision. To calculate a discretized gradient vector $k_U^{(l)} = \{k_{U;1}^{(l)}, \ldots, k_{U;M}^{(l)}\}$, considering a resolution limit of an arbitrary waveform generator (AWG) that controls a source of the waveform, a discrete time step can be set as short as possible, an example parameter is 0.5 ns, and a learning rate is based on an actual situation, which is empirically set to $\alpha_U \approx 0.08$ GHz². The parameters $\{Q_{c;m}^{(l)}\}$ and $\{Q_{d;m}^{(l)}\}$ can be calculated according to the control waveform $\mu_A^{(l)} = \{\mu_{A;1}^{(l)}, \ldots, \mu_{A;M}^{(l)}\}$ in the $l^{th}$ iteration. Finally, by using the gradient calculated by using the formula (37), a waveform $\mu_A^{(l+1)}$ of a next step is calculated according to the formula (36). In an actual experiment, to better generate the waveform and alleviate impact of filtering in a circuit, the discretized waveform can be re-interpolated as a continuous waveform and sent to the AWG for a next iteration.

(b) Experimental processes and results of an optimization solution based on a density matrix For an optimization solution based on a density matrix, in a theoretical solution, for the sake of simplicity, only an initial state is selected, but in fact, the selection of the initial state can be diverse. For example, two initial states, $\phi(0) = (|0\rangle + |1\rangle)\otimes(|0\rangle - |1\rangle)/2$ and $\phi'(0) = (|0\rangle - |1\rangle)\otimes(|0\rangle + |1\rangle)/2$ can be considered, which can be obtained by applying revolving gates of $\{Y/2, -Y/2\}$ and $\{-Y/2, Y/2\}$ to a ground state respectively. The selection of the two initial states is to partially offset impact caused by experimental preparation and measurement errors. Similarly, it is started from the initial waveform $\mu_A^{(0)}(t)$ of the first solution. In the $l^{th}$ iteration step, an external field with a waveform $\mu_A^{(l)}(t)$ is applied, and output quantum states of the two selected initial states after passing through the external field are measured through the QST. For each output quantum state $\rho_{f;exp}^{(l)}$, the gradient vector $k_\rho^{(l)} = \{k_{\rho;1}^{(l)}, \ldots, k_{\rho;M}^{(l)}\}$ is calculated by the waveform $\mu_A^{(l)} = \{\mu_{A;1}^{(l)}, \ldots, \mu_{A;M}^{(l)}\}$ and $\rho_{f;exp}^{(l)}$ according to the formula (73). Because the two selected states are symmetric, two obtained gradients are averaged, and a next waveform $\mu_A^{(l+1)}$ is calculated by the formula (72). A selected example parameter of the learning rate is $\alpha_\rho \approx 0.06$ GHz², and is similarly interpolated as a continuous waveform and sent to the AWG.

This application provides two different data-driven GRAPE optimization solutions for CZ gate optimization. The two solutions are respectively based on a gate operator and a particular output density matrix, and obtain an optimal control external field by minimizing two different objective functions. According to a feedback control mechanism, the key point of each solution is to use mixed information of an input control external field and an experimental measurement value (an actual gate operator or an actual output density matrix) to numerically calculate a gradient vector. Based on the theory, this application uses an SC qubit system to demonstrate an optimized implementation of a two-bit CZ gate. Compared with the related art, the GRAPE algorithm is relatively efficient in terms of optimization speed, especially for a case that a parameter space is large.

The following are apparatus embodiments of this application, which can be used for performing the method embodiments of this application. For details not disclosed in the apparatus embodiments of this application, reference may be made to the method embodiments of this application.

Figure 5:
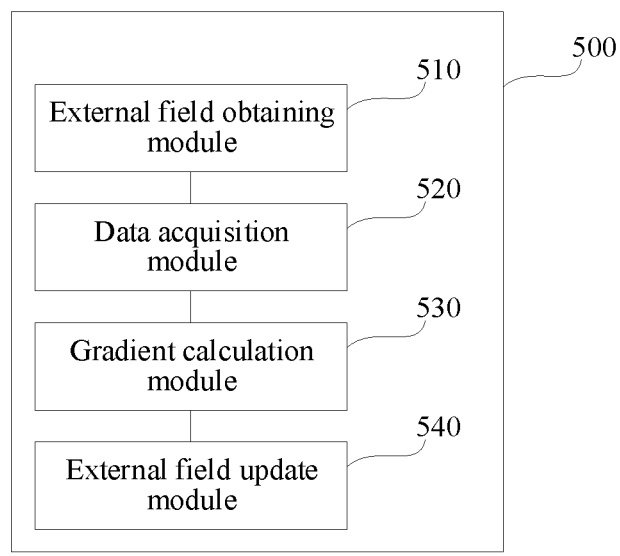
FIG. 5 is a block diagram of a quantum gate optimization apparatus according to this application.

FIG. 5 shows a block diagram of a quantum gate optimization apparatus 500 according to an embodiment of this application. The apparatus 500 has functions of implementing the foregoing method embodiments. The functions may be implemented by hardware, or may be implemented by hardware executing corresponding software. The apparatus 500 may be the computer device described above, or may be disposed in the computer device. As shown in FIG. 5, the apparatus 500 may include: an external field obtaining module 510, a data acquisition module 520, a gradient calculation module 530, and an external field update module 540.

The external field obtaining module 510 is configured to obtain an initialized control external field corresponding to a quantum gate.

The data acquisition module 520 is configured to apply the control external field to a qubit corresponding to the quantum gate and acquire actual measurement data of the quantum gate, the actual measurement data being used for reflecting an actual characteristic of the quantum gate.

The gradient calculation module 530 is configured to calculate a gradient corresponding to the control external field based on the actual measurement data and ideal data.

The external field update module 540 is configured to update the control external field according to the gradient to obtain an updated control external field, the updated control external field being applied to the qubit corresponding to the quantum gate to optimize precision of the quantum gate.

In an exemplary embodiment, the gradient calculation module 530 is configured to:

derive a gradient calculation formula according to an objective function and a waveform function corresponding to the control external field, the objective function being configured to measure a gap between the actual measurement data and the ideal data, an optimization objective of the objective function being to minimize a value of the objective function; and calculate, by using the gradient calculation formula, the gradient corresponding to the control external field based on the actual measurement data and the ideal data.

In an exemplary embodiment, the actual measurement data includes an actual gate operator corresponding to the quantum gate. The data acquisition module 520 is configured to perform QPT on the quantum gate to obtain a process matrix corresponding to the quantum gate; and determine the actual gate operator corresponding to the quantum gate based on the process matrix corresponding to the quantum gate.

In an exemplary embodiment, the actual measurement data includes an actual output density matrix corresponding to the quantum gate. The data acquisition module 520 is configured to obtain at least one selected input quantum state; process the input quantum state through the quantum gate to obtain an output quantum state; and perform QST on the output quantum state to obtain an actual output density matrix corresponding to the quantum gate.

In an exemplary embodiment, the external field update module 540 is configured to calculate an updated value according to the gradient and a learning rate; and calculate the updated control external field according to a current control external field and the updated value.

In an exemplary embodiment, the data acquisition module 520 is configured to divide the control external field by time to obtain a pulse waveform sequence, the pulse waveform sequence including pulse waveforms corresponding to a plurality of time points; and apply the pulse waveforms corresponding to the plurality of time points to the qubit corresponding to the quantum gate.

In an exemplary embodiment, the apparatus 500 further includes a condition determining module (which is not shown in FIG. 5), configured to:

when the quantum gate does not meet an optimization end condition, use the updated control external field as the current control external field, and repeat the operations of applying the current control external field to the qubit corresponding to the quantum gate, acquiring the actual measurement data of the quantum gate, calculating a gradient corresponding to the current control external field, and updating the current control external field until the quantum gate meets the optimization end condition; and the optimization end condition including at least one of the following: the actual characteristic of the quantum gate reflected by the actual measurement data reaches a set index, or a change of the control external field before and after the update is less than a set value.

In view of the above, the quantum gate optimization solution provided in this application is a closed-loop optimization solution driven and implemented by data feedback. By combining a gradient-constrained optimization algorithm with actual measurement data, on the one hand, due to the gradient-constrained optimization of the control external field, this application can shorten an optimization time and lower optimization costs compared with some optimization solution without gradient constraints, and on the other hand, because the actual measurement data of the quantum gate is acquired during optimizations, and optimization is performed by using the actual measurement data as feedback, this application ensures the effect and precision of optimization. With reference to the foregoing two aspects, this application achieves a quantum gate optimization solution that improves both the precision and efficiency.

When the apparatus provided in the foregoing embodiments implements functions of the apparatus, division of the foregoing functional modules is merely an example for description. In the practical application, the functions may be assigned to and completed by different functional modules according to the requirements, that is, the internal structure of the device is divided into different functional modules, to implement all or some of the functions described above. In addition, the apparatus and method embodiments provided in the foregoing embodiments belong to the same concept. For the specific implementation process, reference may be made to the method embodiments, and details are not described herein again. In this application, the term "unit" or "module" refers to a computer program or part of the computer program that has a pre-defined function and works together with other related parts to achieve a predefined goal and may be all or partially implemented by using software, hardware (e.g., processing circuitry and/or memory configured to perform the pre-defined functions), or a combination thereof. Each unit or module can be implemented using one or more processors (or processors and memory). Likewise, a processor (or processors and memory) can be used to implement one or more modules or units. Moreover, each module or unit can be part of an overall module that includes the functionalities of the module or unit.

Figure 6:
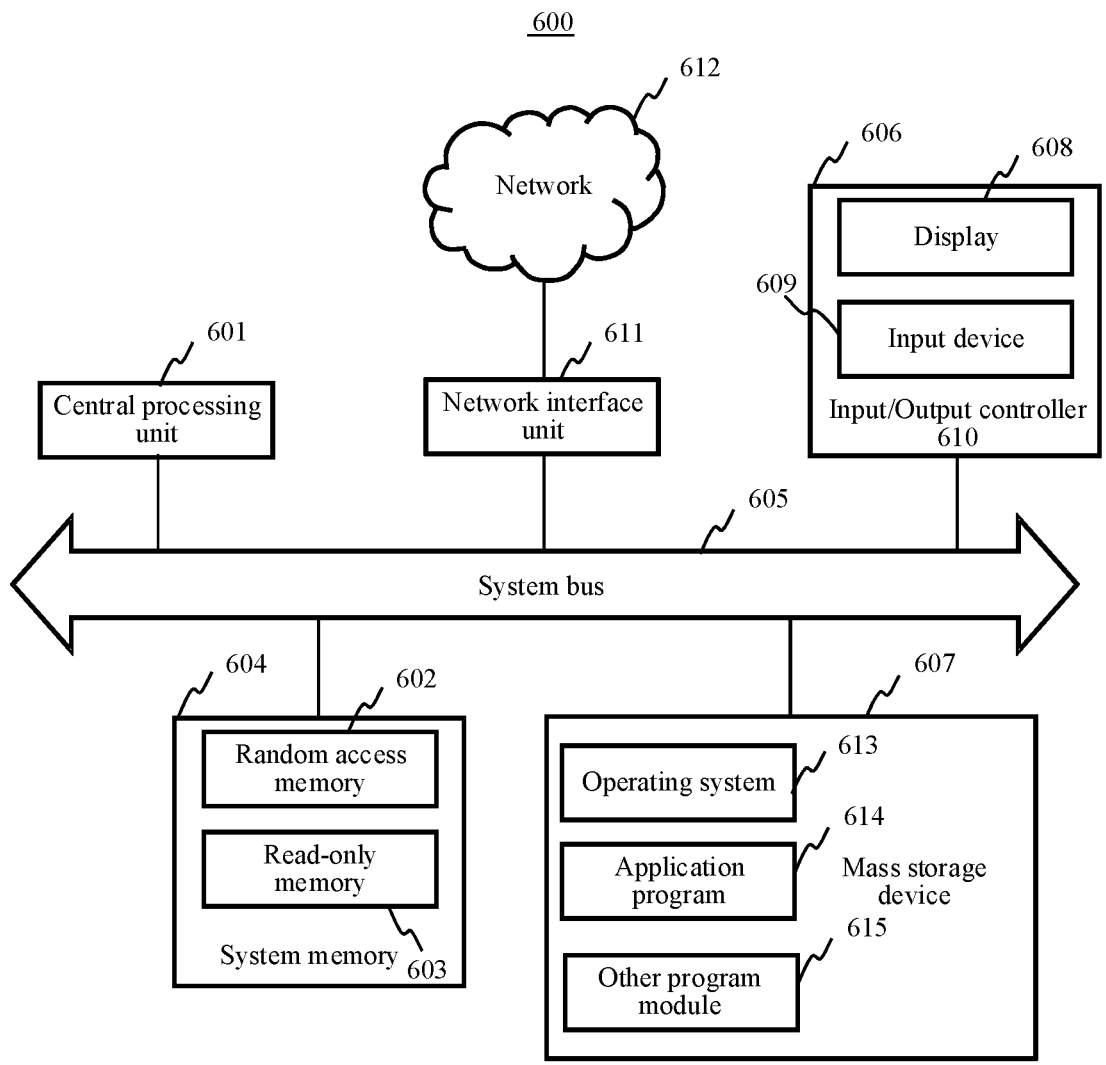
FIG. 6 is a structural block diagram of a computer device according to this application.

FIG. 6 is a structural block diagram of a computer device according to an embodiment of this application. The computer device may be configured to implement the quantum gate optimization method provided in the foregoing embodiments. For example, the computer device is a classic computer.

The computer device 600 includes a processing unit (for example, a central processing unit (CPU), a graphics processing unit (GPU) and a field programmable gate array (FPGA), etc.) 601, a system memory 604 including a random-access memory (RAM) 602 and a read-only memory (ROM) 603, and a system bus 605 connecting the system memory 604 and the central processing unit 601. The computer device 600 further includes a basic input/output (I/O) system 606 assisting in transmitting information between components in a server, and a mass storage device 607 configured to store an operating system 613, an application program 614, and another program module 615.

The basic I/O system 606 includes a display 608 configured to display information and an input device 609, such as a mouse or a keyboard, for a user to input information. The display 608 and the input device 609 are both connected to the CPU 601 by using an input/output controller 610 connected to the system bus 605. The basic I/O system 606 may further include the I/O controller 610 configured to receive and process inputs from a plurality of other devices such as a keyboard, a mouse, or an electronic stylus. Similarly, the I/O controller 610 further provides an output to a display screen, a printer or another type of an output device.

The mass storage device 607 is connected to the CPU 601 by using a mass storage controller (which is not shown) connected to the system bus 605. The mass storage device 607 and an associated computer-readable medium provide non-volatile storage for the computer device 600. That is, the mass storage device 607 may include a computer-readable medium (which is not shown) such as a hard disk or a compact disc read-only memory (CD-ROM) drive.

Without loss of generality, the computer-readable medium may include a computer storage medium and a communication medium. The computer storage medium includes volatile and non-volatile media, and removable and non-removable media implemented by using any method or technology used for storing information such as computer-readable instructions, data structures, program modules, or other data. The computer storage medium includes a RAM, a ROM, an erasable programmable read-only memory (EPROM), an electrically erasable programmable read-only memory (EEPROM), a flash memory or another solid-state memory technology, a CD-ROM, a digital video disc (DVD) or another optical memory, a tape cartridge, a magnetic cassette, a magnetic disk memory, or another magnetic storage device. Certainly, a person skilled in the art may learn that the computer storage medium is not limited to the foregoing types. The system memory 604 and the mass storage device 607 may be collectively referred to as a memory.

According to the embodiments of this application, the computer device 600 may be further connected, through a network such as the Internet, to a remote computer on the network and run. That is, the computer device 600 may be connected to a network 612 by using a network interface unit 611 connected to the system bus 605, or may be connected to another type of network or a remote computer system (which is not shown) by using a network interface unit 611.

The memory further includes at least one instruction, at least one program, a code set, or an instruction set. The at least one instruction, the at least one program, the code set, or the instruction set is stored in the memory and is configured to be executed by one or more processors to implement the foregoing quantum gate optimization method.

In an exemplary embodiment, a computer-readable storage medium is further provided, storing at least one instruction, at least one program, a code set, or an instruction set, the at least one instruction, the at least one program, the code set, or the instruction set, when executed by a processor, implementing the quantum gate optimization method.

In some embodiments, the computer-readable storage medium may include a read-only memory (ROM), a random-access memory (RAM), a solid state drive (SSD), an optical disc, or the like. The RAM may include a resistive random access memory (ReRAM) and a dynamic random access memory (DRAM).

In an exemplary embodiment, a computer program product or a computer program is provided. The computer program product or the computer program includes computer instructions, and the computer instructions are stored in a computer-readable storage medium. The processor of the computer device reads the computer instructions from the computer-readable storage medium, and executes the computer instructions, to cause the computer device to perform the foregoing quantum gate optimization method.

"Plurality of" mentioned in the specification means two or more. "And/or" describes an association relationship for describing associated objects and represents that three relationships may exist. For example, A and/or B may represent the following three cases: Only A exists, both A and B exist, and only B exists. The character "/" in this specification generally indicates an "or" relationship between the associated objects. In addition, the step numbers described in this specification merely exemplarily show a possible execution sequence of the steps. In some other embodiments, the steps may not be performed according to the number sequence. For example, two steps with different numbers may be performed simultaneously, or two steps with different numbers may be performed according to a sequence contrary to the sequence shown in the figure. This is not limited in the embodiments of this application.

The foregoing descriptions are merely exemplary embodiments of this application, but are not intended to limit this application. Any modification, equivalent replacement, or improvement made within the spirit and principle of this application shall fall within the protection scope of this application.

What is claimed is:

1. A quantum gate optimization method, performed by a computer device, the method comprising:
   obtaining an initialized control external field corresponding to a quantum gate in a quantum chip;
   applying the control external field to a quantum bit (qubit) corresponding to the quantum gate, wherein the initialized control external field is a microwave drive applied to the quantum gate via a measurement and control system that is communicatively connected to the quantum gate;
   acquiring actual measurement data of the quantum gate via the measurement and control system, the actual measurement data being used for reflecting an actual characteristic of the quantum gate;
   calculating a gradient corresponding to the control external field based on a comparison between the actual measurement data and ideal data, the ideal data being used for reflecting an ideal characteristic of the quantum gate;
   updating the control external field according to the gradient to obtain an updated control external field; and
   applying the updated control external field to the qubit corresponding to the quantum gate via the via the measurement and control system to optimize precision of the quantum gate.

2. The method according to claim 1, wherein the calculating a gradient corresponding to the control external field based on the actual measurement data and ideal data comprises:
   deriving a gradient calculation formula according to an objective function and a waveform function corresponding to the control external field, the objective function being configured to measure a gap between the actual measurement data and the ideal data, an optimization objective of the objective function being used to minimize a value of the objective function; and
   calculating, by using the gradient calculation formula, the gradient corresponding to the control external field based on the actual measurement data and the ideal data.

3. The method according to claim 2, wherein the actual measurement data comprises an actual gate operator corresponding to the quantum gate, and the objective function is:

$$\mathcal{F}_U = \|U_d^\dagger U_c - U_{CZ}\|^2 = 2 - Tr\{U_c^\dagger U_d U_{CZ}\} - Tr\{U_{CZ} U_d^\dagger U_c\} \quad (3)$$

the corresponding gradient calculation formula being:

$$k_{U,m} = \frac{\partial \mathcal{F}_U}{\partial \mu_{A;m}} =$$

$$-Tr\left\{\frac{\partial U_c^\dagger}{\partial \mu_{A;m}} U_d U_{CZ} + U_c^\dagger \frac{\partial U_d}{\partial \mu_{A;m}} U_{CZ} + U_{CZ} \frac{\partial U_d^\dagger}{\partial \mu_{A;m}} U_c + U_{CZ} U_d^\dagger \frac{\partial U_c}{\partial \mu_{A;m}}\right\} \approx$$

$$-i\tau Tr\{Q_{c;m} U_c^\dagger U_d U_{CZ} - U_{CZ} U_d^\dagger U_c Q_{c;m} + U_{CZ} Q_{d;m} U_d^\dagger U_c -$$

$$U_c^\dagger U_d Q_{d;m} U_{CZ}\} = 2\tau \text{Im} Tr\{Q_{c;m} (U_d^\dagger U_c)^\dagger U_{CZ}\} + 2\tau \text{Im} Tr\{Q_{d;m} (U_d^\dagger U_c) U_{CZ}\}$$

$U_c$ representing a total time evolution operator corresponding to the quantum gate, $U_d$ representing a time evolution operator corresponding to the quantum gate without inter-bit coupling, $U_{CZ}$ representing an ideal gate operator corresponding to the quantum gate, $U_d^\dagger U_c$ being replaced by $U_{exp}$, $U_{exp}$ representing the actual gate operator corresponding to the quantum gate, $\tau=T/M$, $\mu_{A;m}$ representing the $m^{th}$ pulse waveform in a pulse waveform sequence obtained by dividing the control external field $\mu_A$ by time, $Q_{c;m}$ representing a calculated value of a coupling term corresponding to the $m^{th}$ pulse waveform, $Q_{d;m}$ representing a calculated value of a decoupling term corresponding to the $m^{th}$ pulse waveform, and Im representing an imaginary component of a complex number.

4. The method according to claim 2, wherein the actual measurement data comprises an actual output density matrix corresponding to the quantum gate, and the objective function is:

$$\mathcal{F}_\rho = \|\rho_f - \rho_{ideal}\|^2$$

$$= Tr\{[\rho_f - \rho_{ideal}]^\dagger [\rho_f - \rho_{ideal}]\}$$

$$\approx 2 - 2Tr\{\rho_{ideal} \rho_f\} \approx 2 - 2\rho_{ideal}^\dagger \rho_f$$

$$= 2 - 2\rho_{ideal}^\dagger \mathcal{U}_d^{-1} \mathcal{U}_c \rho(0)$$

the corresponding gradient calculation formula being:

$$k_{\rho;m} = \frac{\partial \mathcal{F}_\rho}{\partial \mu_{A;m}} = -2\rho_{ideal}^\dagger \left[\frac{\partial \mathcal{U}_d^{-1}}{\partial \mu_{A;m}} \mathcal{U}_c + \mathcal{U}_d^{-1} \frac{\partial \mathcal{U}_c}{\partial \mu_{A;m}}\right] \rho(0) =$$

$$2i\tau[\rho_{ideal}^\dagger Q_{c;m} \mathcal{U}_d^{-1} \mathcal{U}_c \rho(0) - \rho_{ideal}^\dagger Q_{d;m} \mathcal{U}_d^{-1} \mathcal{U}_c \rho(0)]$$

$\rho_f$ representing an output density matrix corresponding to the quantum gate, $\rho_{ideal}$ representing an ideal output density matrix corresponding to the quantum gate, $\rho(0)$ representing an input density matrix corresponding to the quantum gate, $\mathcal{U}_c$ representing a time evolution super operator of a coupling term, $\mathcal{U}_d$ representing a time evolution super operator of a decoupling term, $\mathcal{U}_d^{-1} \mathcal{U}_c \rho(0)$ being replaced by $\rho_{f;exp}$, $\rho_{f;exp}$ representing an actual output density matrix corresponding to the quantum gate, $\tau=T/M$, $\mu_{A;m}$ represents the $m^{th}$ pulse waveform in a pulse waveform sequence obtained by dividing the control external field $\mu_A$ by time, $Q_{c;m}$ representing a calculated value of a coupling term corresponding to the $m^{th}$ pulse waveform, $Q_{d;m}$ representing a calculated value of a decoupling term corresponding to the $m^{th}$ pulse waveform, and i representing an imaginary unit.

5. The method according to claim 1, wherein the actual measurement data comprises an actual gate operator corresponding to the quantum gate; and
the acquiring actual measurement data of the quantum gate comprises:
performing quantum process tomography (QPT) on the quantum gate to obtain a process matrix corresponding to the quantum gate; and
determining the actual gate operator corresponding to the quantum gate based on the process matrix corresponding to the quantum gate.

6. The method according to claim 1, wherein the actual measurement data comprises an actual output density matrix corresponding to the quantum gate; and
the acquiring actual measurement data of the quantum gate comprises:
obtaining at least one selected input quantum state;
processing the input quantum state through the quantum gate to obtain an output quantum state; and
performing quantum state tomography (QST) on the output quantum state to obtain the actual output density matrix corresponding to the quantum gate.

7. The method according to claim 1, wherein the updating the control external field according to the gradient to obtain an updated control external field comprising:
calculating an updated value according to the gradient and a learning rate, the learning rate being an empirical constant; and
calculating the updated control external field according to a current control external field and the updated value.

8. The method according to claim 1, wherein the applying the control external field to a qubit corresponding to the quantum gate comprises:
dividing the control external field by time to obtain a pulse waveform sequence, the pulse waveform sequence comprising pulse waveforms corresponding to a plurality of time points; and
applying the pulse waveforms corresponding to the plurality of time points to the qubit corresponding to the quantum gate.

9. The method according to claim 1, wherein after the updating the control external field according to the gradient to obtain an updated control external field, the method further comprises:
when the quantum gate does not meet an optimization end condition, using the updated control external field as a current control external field, and repeating the operations of applying the current control external field to the qubit corresponding to the quantum gate, acquiring the actual measurement data of the quantum gate, calculating a gradient corresponding to the current control external field, and updating the current control external field until the quantum gate meets the optimization end condition; and
the optimization end condition comprising at least one of the following: the actual characteristic of the quantum gate reflected by the actual measurement data reaches a set index, or a change of the control external field before and after the update is less than a set value.

10. The method according to claim 1, wherein a waveform function corresponding to the initialized control external field is:

$$\mu(t) = \frac{\Gamma}{2} \left\{ \text{erf}\left(\frac{4\sqrt{\ln 2}}{\sigma}[t - (t_0 + \sigma)]\right) - \text{erf}\left(\frac{4\sqrt{\ln 2}}{\sigma}[t - (t_0 + \tau - \sigma)]\right) \right\}$$

erf(x) being a Gaussian error function defined as $$\text{erf}(x) = \frac{2}{\sqrt{\pi}} \int_0^x e^{-\tau^2} d\tau,$$

a parameter $t_0=0$ representing a start time, I and T respectively representing an amplitude and a time length of a pulse of the initialized control external field, σ being related to curvature of an edge of the pulse, and t≥0.

11. A computer device, comprising a processor and a memory, the memory storing at least one instruction, the at least one instruction, when executed by the processor, causing the computer device to perform a quantum gate optimization method including:
   obtaining an initialized control external field corresponding to a quantum gate in a quantum chip;
   applying the control external field to a quantum bit (qubit) corresponding to the quantum gate, wherein the initialized control external field is a microwave drive applied to the quantum gate via a measurement and control system that is communicatively connected to the quantum gate;
   acquiring actual measurement data of the quantum gate via the measurement and control system, the actual measurement data being used for reflecting an actual characteristic of the quantum gate;
   calculating a gradient corresponding to the control external field based on a comparison between the actual measurement data and ideal data, the ideal data being used for reflecting an ideal characteristic of the quantum gate;
   updating the control external field according to the gradient to obtain an updated control external field; and
   applying the updated control external field to the qubit corresponding to the quantum gate via the via the measurement and control system to optimize precision of the quantum gate.

12. The computer device according to claim 11, wherein the calculating a gradient corresponding to the control external field based on the actual measurement data and ideal data comprises:
   deriving a gradient calculation formula according to an objective function and a waveform function corresponding to the control external field, the objective function being configured to measure a gap between the actual measurement data and the ideal data, an optimization objective of the objective function being used to minimize a value of the objective function; and
   calculating, by using the gradient calculation formula, the gradient corresponding to the control external field based on the actual measurement data and the ideal data.

13. The computer device according to claim 11, wherein the actual measurement data comprises an actual gate operator corresponding to the quantum gate; and
   the acquiring actual measurement data of the quantum gate comprises:
   performing quantum process tomography (QPT) on the quantum gate to obtain a process matrix corresponding to the quantum gate; and
   determining the actual gate operator corresponding to the quantum gate based on the process matrix corresponding to the quantum gate.

14. The computer device according to claim 11, wherein the actual measurement data comprises an actual output density matrix corresponding to the quantum gate; and
   the acquiring actual measurement data of the quantum gate comprises:
   obtaining at least one selected input quantum state;
   processing the input quantum state through the quantum gate to obtain an output quantum state; and
   performing quantum state tomography (QST) on the output quantum state to obtain the actual output density matrix corresponding to the quantum gate.

15. The computer device according to claim 11, wherein the updating the control external field according to the gradient to obtain an updated control external field comprising:
   calculating an updated value according to the gradient and a learning rate, the learning rate being an empirical constant; and
   calculating the updated control external field according to a current control external field and the updated value.

16. The computer device according to claim 11, wherein the applying the control external field to a qubit corresponding to the quantum gate comprises:
   dividing the control external field by time to obtain a pulse waveform sequence, the pulse waveform sequence comprising pulse waveforms corresponding to a plurality of time points; and
   applying the pulse waveforms corresponding to the plurality of time points to the qubit corresponding to the quantum gate.

17. The computer device according to claim 11, wherein the method further comprises:
   after updating the control external field according to the gradient to obtain an updated control external field,
   when the quantum gate does not meet an optimization end condition, using the updated control external field as a current control external field, and repeating the operations of applying the current control external field to the qubit corresponding to the quantum gate, acquiring the actual measurement data of the quantum gate, calculating a gradient corresponding to the current control external field, and updating the current control external field until the quantum gate meets the optimization end condition; and
   the optimization end condition comprising at least one of the following: the actual characteristic of the quantum gate reflected by the actual measurement data reaches a set index, or a change of the control external field before and after the update is less than a set value.

18. A non-transitory computer-readable storage medium, storing at least one instruction, the at least one instruction, when executed by a processor of a computer device, causing the computer device to perform a quantum gate optimization method including:
   obtaining an initialized control external field corresponding to a quantum gate in a quantum chip;
   applying the control external field to a quantum bit (qubit) corresponding to the quantum gate, wherein the initialized control external field is a microwave drive applied to the quantum gate via a measurement and control system that is communicatively connected to the quantum gate;
   acquiring actual measurement data of the quantum gate via the measurement and control system, the actual measurement data being used for reflecting an actual characteristic of the quantum gate;

calculating a gradient corresponding to the control external field based on a comparison between the actual measurement data and ideal data, the ideal data being used for reflecting an ideal characteristic of the quantum gate;

updating the control external field according to the gradient to obtain an updated control external field; and applying the updated control external field to the qubit corresponding to the quantum gate via the via the measurement and control system to optimize precision of the quantum gate.

19. The non-transitory computer-readable storage medium according to claim 18, wherein the calculating a gradient corresponding to the control external field based on the actual measurement data and ideal data comprises:

deriving a gradient calculation formula according to an objective function and a waveform function corresponding to the control external field, the objective function being configured to measure a gap between the actual measurement data and the ideal data, an optimization objective of the objective function being used to minimize a value of the objective function; and calculating, by using the gradient calculation formula, the gradient corresponding to the control external field based on the actual measurement data and the ideal data.

20. The non-transitory computer-readable storage medium according to claim 18, wherein the applying the control external field to a qubit corresponding to the quantum gate comprises:

dividing the control external field by time to obtain a pulse waveform sequence, the pulse waveform sequence comprising pulse waveforms corresponding to a plurality of time points; and applying the pulse waveforms corresponding to the plurality of time points to the qubit corresponding to the quantum gate.

* * * * *